United States Patent
He et al.

(10) Patent No.: US 11,737,361 B2
(45) Date of Patent: Aug. 22, 2023

(54) HIGH CURRENT OTFT DEVICES WITH VERTICAL DESIGNED STRUCTURE AND DONOR-ACCEPTOR BASED ORGANIC SEMICONDUCTOR MATERIALS

(71) Applicants: Corning Incorporated, Corning, NY (US); NATIONAL YANG MING CHIAO TUNG UNIVERSITY, Hsin-chu (TW)

(72) Inventors: Mingqian He, Horseheads, NY (US); Robert George Manley, Ocala, FL (US); Karan Mehrotra, Montour Falls, NY (US); Hsin-Fei Meng, Hsinchu (TW); Hsiao-Wen Zan, Hsinchu (TW)

(73) Assignees: CORNING INCORPORATED, Corning, NY (US); NATIONAL YANG MING CHIAO TUNG UNIVERSITY, Hsin-Chu (TW)

( * ) Notice: Subject to any disclaimer, the term of this patent is extended or adjusted under 35 U.S.C. 154(b) by 0 days.

(21) Appl. No.: 17/873,240

(22) Filed: Jul. 26, 2022

(65) Prior Publication Data
US 2022/0384737 A1 Dec. 1, 2022

Related U.S. Application Data

(63) Continuation of application No. 16/695,371, filed on Nov. 26, 2019, now Pat. No. 11,437,587.

(30) Foreign Application Priority Data

Nov. 29, 2018 (CN) .......................... 201811442578.7

(51) Int. Cl.
*H01L 51/50* (2006.01)
*H01L 51/00* (2006.01)

(52) U.S. Cl.
CPC ...... *H01L 51/0072* (2013.01); *H01L 51/0003* (2013.01); *H01L 51/0017* (2013.01); *H01L 51/0067* (2013.01); *H01L 51/0068* (2013.01); *H01L 51/0073* (2013.01); *H01L 51/0074* (2013.01)

(58) Field of Classification Search
None
See application file for complete search history.

(56) References Cited

U.S. PATENT DOCUMENTS

| 7,692,269 B2 | 4/2010 | Meng et al. |
| 7,705,108 B2 | 4/2010 | He |
| 7,772,079 B2 | 8/2010 | Meng et al. |

(Continued)

FOREIGN PATENT DOCUMENTS

WO   2016/123286 A1   8/2016

OTHER PUBLICATIONS

Chao et al; "High-Performance Solution-Processed Polymer Space-Charge-Limited Transistor"; Organic Electronics, 9 (2008) pp. 310-316.

(Continued)

*Primary Examiner* — Gregory D Clark
(74) *Attorney, Agent, or Firm* — Travis B. Gasa

(57) ABSTRACT

Devices include a substrate, a collector layer, and an emitter layer positively biased relative to the collector. Devices further include a semiconductor layer located between the collector and the emitter. The semiconductor layer includes an organic semiconductor polymer with a donor-acceptor structure.

19 Claims, 8 Drawing Sheets

(56) References Cited

U.S. PATENT DOCUMENTS

| | | |
|---|---|---|
| 7,791,068 B2 | 9/2010 | Meng et al. |
| 7,838,623 B2 | 11/2010 | He |
| 7,893,191 B2 | 2/2011 | He |
| 8,258,554 B2 | 9/2012 | Meng et al. |
| 8,389,669 B2 | 3/2013 | He |
| 8,624,232 B2 | 1/2014 | Sonar et al. |
| 8,629,865 B2 | 1/2014 | Loebl et al. |
| 9,331,294 B2 | 5/2016 | Zan et al. |
| 2009/0230383 A1 | 9/2009 | Meng et al. |
| 2011/0284949 A1 | 11/2011 | Meng et al. |
| 2014/0045297 A1 | 2/2014 | Meng et al. |

OTHER PUBLICATIONS

Chao et al; "Polymer Space-Charge-Limited Transistor"; Appl. Phys. Leti, 88 (2006) 223510-223510-3.

Huang Kuan-Min et al: "2-v operated flexible vertical organic transistor with good air stability and bias stress reliability", Organic Electronics, vol. 50, Aug. 5, 2017, pp. 325-330, XP085198718.

International Search Report and Writen Opinion of the European International Searching Authority; PCT/US2019/061915; dated Feb. 17, 2020; 11 Pgs.

International Search Report and Written Opinion of the International Searching Authority; PCT/US19/061915; dated Feb. 17, 2020; 9 Pages; European Patent Office.

HIGH CURRENT OTFT DEVICES WITH VERTICAL DESIGNED STRUCTURE AND DONOR-ACCEPTOR BASED ORGANIC SEMICONDUCTOR MATERIALS

This application is a continuation of and claims the benefit of priority under 35 U.S.C. § 120 of U.S. application Ser. No. 16/695,371, filed on Nov. 26, 2019, which claims priority under 35 U.S.C. § 119 of Chinese Patent Application Serial No. 201811442578.7 filed on Nov. 29, 2018, the content of which is relied upon and incorporated herein by reference in its entirety.

BACKGROUND

Field

Described herein are electronics that incorporate heterocyclic organic compounds. More specifically, described herein are organic electronics systems that are combined with donor-acceptor organic semiconductors, along with methods for making such devices, and uses thereof.

Technical Background

An explosion of interest in organic electronics has given rise to extensive research on organic semiconductor devices, like organic light-emitting diodes, organic field-effect transistors (OFETs), organic chemical sensors, and polymer solar cells. Organic semiconductor devices may open the possibility of a completely new paradigm of fabrication process and applications. Organic semiconductors are envisaged to substantially reduce the cost over their inorganic counterparts such as silicon, if they can be deposited from solution, as this enables fast, large-area fabrication routes such as spin-coating, ink-jet printing, gravure printing, transfer printing and other printing processes, and could have applications in smart cards, security tags, low cost sensors, and as switching elements in the backplane of flat panel displays. Newly developed disposable products such as organic radio-frequency identification (RFID) devices may be attached to the packaging of goods. Flexible organic electronics can be potentially rollable and applied to non-planar surfaces.

One of the key components of flexible electronics is the field effect transistor (FET), a horizontal device with source and drain electrodes on the same plane. In the "off" state, there is no charge carrier channel accumulation between source and drain electrodes in the FET, whereas in the "on" state, current flows between the source and drain electrodes and is controlled by a gate voltage applied to the gate electrode. Such devices are usually operated in an accumulation mode, where the gate bias induces a channel of charge carriers at the insulator-semiconductor interface.

In the case of organic field effect transistors (OFETs), two parameters that are used to characterize their usefulness are the current ratio between the on and off states (on/off ratio) and the field-effect mobility. So far, OFETs show low current output because of the intrinsically low carrier mobility due to the weak wavefunction overlap between the molecules and the disorder in the thin film. The low mobility also strongly limits the operating frequency to under 100 kHz. Furthermore, OFETs tend to be unstable because the conduction channel is confined to a few monolayers at the semiconductor-dielectric interface, where adsorbed oxygen, moisture, and other chemicals can have huge effects on the transistor characteristics. To obtain a desired current output, it's often necessary to operate OFETs at voltages exceeding 20 volts. In the past 10 years, a great deal of effort has been made in to improve the performance of the field-effect transistors by increasing the mobility, reducing the gate dielectrics thickness, and reducing the channel lengths. However, there continues to be a need for OFET devices that provide high relative current densities at low voltages.

Summary

Described herein are polymer compositions including heterocyclic organic compounds, such as fused thiophene compounds, methods for making them, and uses thereof. The compositions and methods described herein possess a number of advantages over prior art compositions and methods. For example, the substituted fused thiophene compositions described herein may be made to be more soluble and processable than the analogous unsubstituted thiophene compositions. Polymers and oligomers including the fused thiophene moieties described herein may be processable using conventional spin-coating operations. Further, the compositions described herein may be made with substantially no □-H content, greatly improving the oxidative stability of the compositions.

In some embodiments, a device comprises: a substrate; a collector layer; an emitter layer positively biased relative to the collector; a metal grid comprising a metal layer having openings, the metal grid located in between, but not in direct contact with, the collector and emitter, wherein each of the openings has a length along its longest dimension of from about 50 nm to about 800 nm; and a semiconductor layer located in between the collector and emitter, the semiconductor layer comprising an organic semiconductor polymer with the structure:

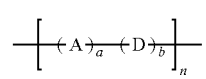

(I)

wherein each D is an independently selected conjugated electron donating aromatic or heteroaromatic group having from 5 to 50 backbone atoms and each D group is optionally substituted with one or more electron donating substituents or electron withdrawing substituents, provided that even when substituted the electronic character of each D is electron donating; each A is an independently selected conjugated electron accepting aromatic or heteroaromatic group having from 5 to 50 backbone atoms or an ethenylene group substituted with one or two electron withdrawing substituents, each A being optionally substituted with one or more electron donating substituents or electron withdrawing substituents provided that even when substituted the electronic character of each A is electron accepting; each of a and b is an integer from 1 to 4, and n is an integer from 2 to 10,000.

In one aspect, which is combinable with any of the other aspects or embodiments, each D is independently a compound found in TABLE 1.

In one aspect, which is combinable with any of the other aspects or embodiments, each A is independently a compound found in TABLE 2.

In one aspect, which is combinable with any of the other aspects or embodiments, the organic semiconductor polymer consists of one of the polymers listed in TABLE 3.

In one aspect, which is combinable with any of the other aspects or embodiments, one or more of $R_1$, $R_2$, $R_3$, $R_4$, and $R_6$ is an optionally substituted $C_{15}$-$C_{35}$ alkyl.

In one aspect, which is combinable with any of the other aspects or embodiments, one or more of $R_1$, $R_2$, or $R_3$ can be optionally substituted $C_{15}$-$C_{35}$ alkyl.

In one aspect, which is combinable with any of the other aspects or embodiments, each $R_1$ or $R_2$ is independently an optionally substituted $C_{15}$-$C_{35}$ alkyl.

In one aspect, which is combinable with any of the other aspects or embodiments, each $R_1$ or $R_2$ is independently an optionally substituted $C_{15}$-$C_{35}$ alkyl having at least one branching point.

In one aspect, which is combinable with any of the other aspects or embodiments, each $R_1$ or $R_2$ is independently an optionally substituted $C_{15}$-$C_{35}$ alkyl having at least one branching point, where the branching point is at least 4 carbons from the base molecule.

In one aspect, which is combinable with any of the other aspects or embodiments, at least one D is:

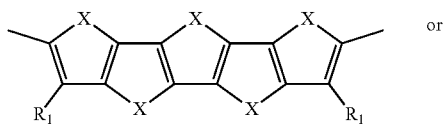

or

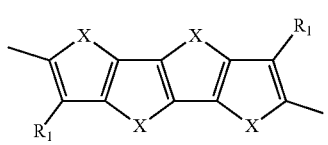

where each X is independently $NR_6$, S, Se, or O; and each $R_1$ is independently hydrogen, $C_1$-$C_{40}$ alkyl, $C_1$-$C_{40}$ alkenyl, $C_1$-$C_{40}$ alkynyl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo, and each $R_6$ is independently hydrogen, $C_1$-$C_{40}$ alkyl.

In one aspect, which is combinable with any of the other aspects or embodiments, at least one A is:

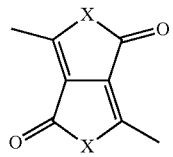

where each x is independently $NR_5$, S, Se, or O; each $R_5$ is independently hydrogen, $C_1$-$C_{40}$ alkyl.

In one aspect, which is combinable with any of the other aspects or embodiments, A is:

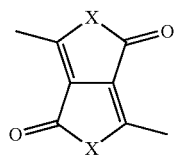

and D is:

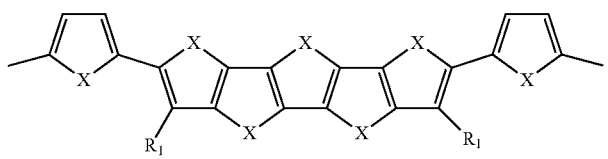

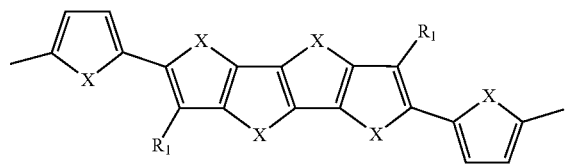

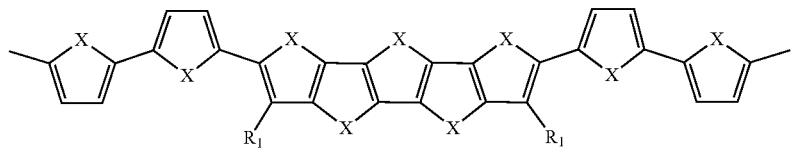

or

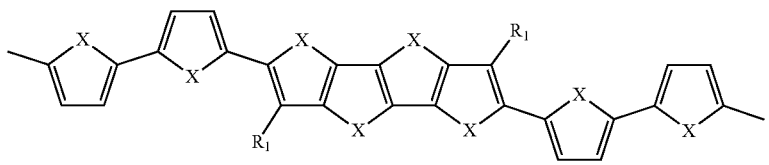

where each X is independently $NR_6$, S, Se, or O; and each $R_1$ is independently hydrogen, $C_1$-$C_{40}$ alkyl, $C_1$-$C_{40}$ alkenyl, $C_1$-$C_{40}$ alkynyl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo and each $R_6$ is independently hydrogen, $C_1$-$C_{40}$alkyl.

In one aspect, which is combinable with any of the other aspects or embodiments, each $R_1$ is independently an optionally substituted $C_{15}$-$C_{35}$ alkyl having at least one branching point.

In one aspect, which is combinable with any of the other aspects or embodiments, the collector comprises a metal, such as aluminum.

In one aspect, which is combinable with any of the other aspects or embodiments, the emitter comprises a transparent conductive oxide such as indium tin oxide or an organic polymer such as poly(3,4-ethylenedioxythiophene) doped with polystyrene sulfonated acid.

In one aspect, which is combinable with any of the other aspects or embodiments, the openings in the metal grid are approximately circular openings and have a length in the longest dimension of from 100 nm to 800 nm or from 200 nm to 500 nm In one aspect, which is combinable with any of the other aspects or embodiments, the metal layer of the metal grid comprises aluminum.

In one aspect, which is combinable with any of the other aspects or embodiments, the organic semiconductor polymer is:

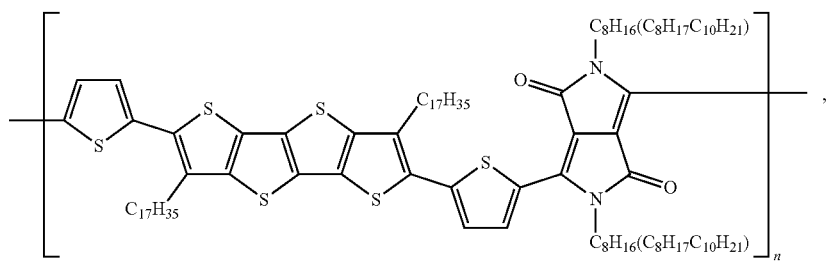

,

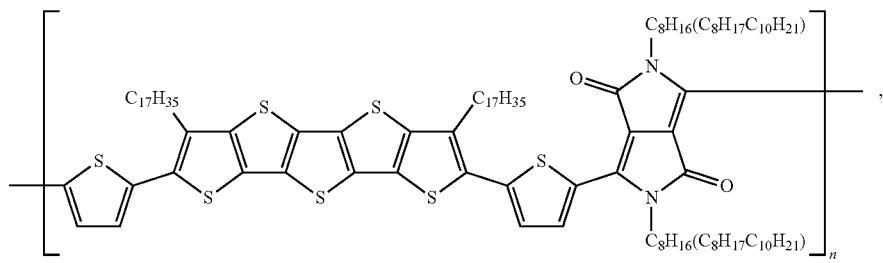

,

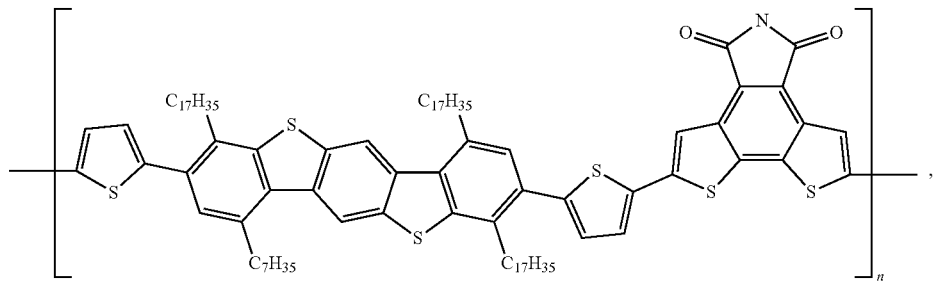

,

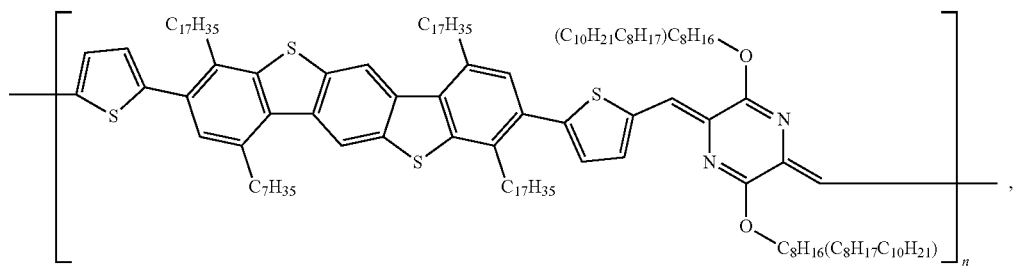

,

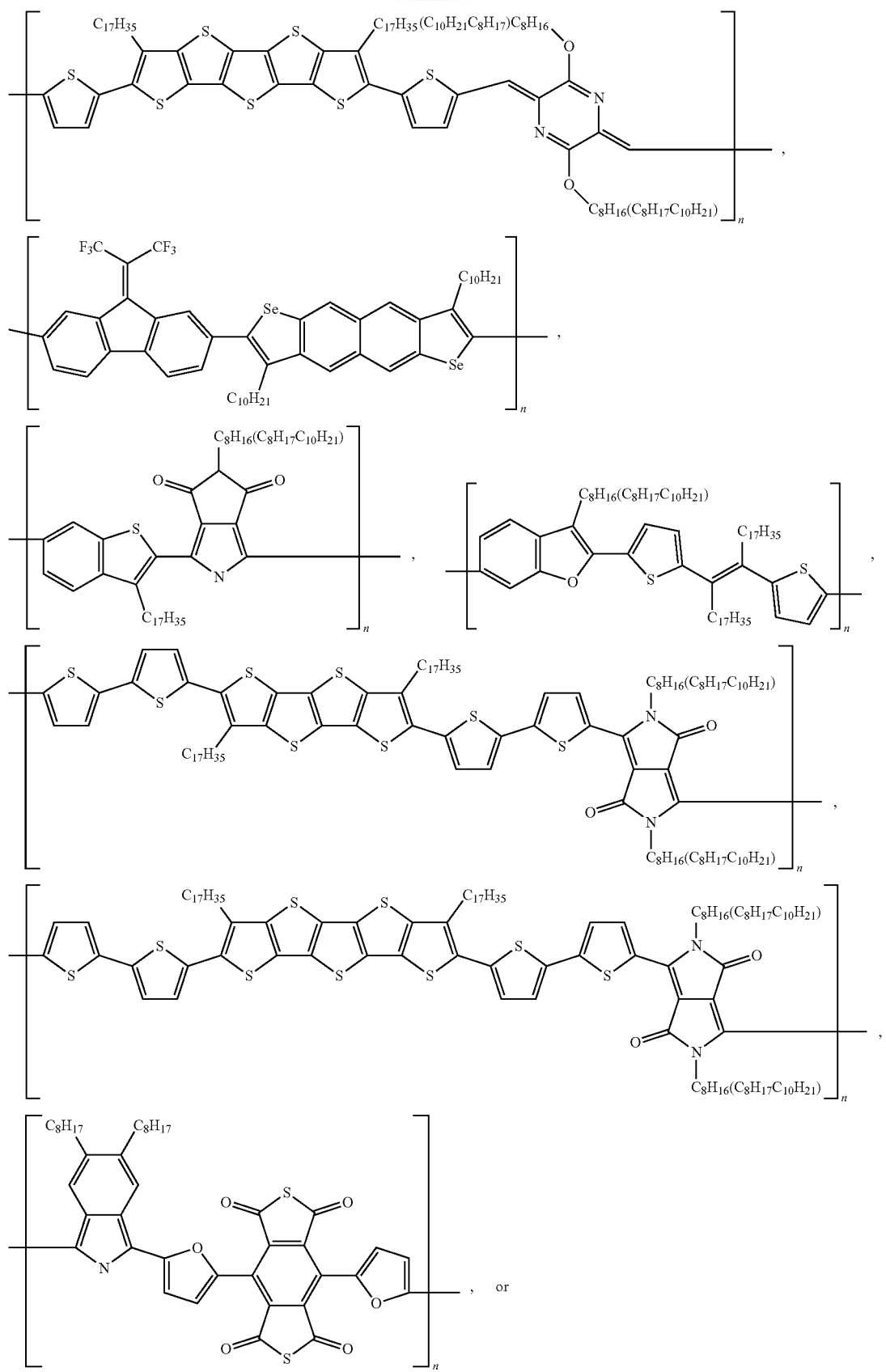

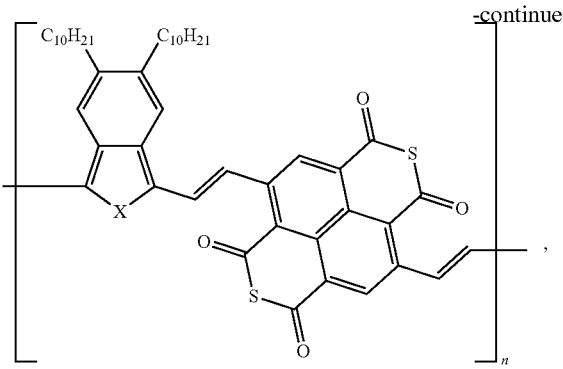

where n is from 2 to 10000.

In one aspect, which is combinable with any of the other aspects or embodiments, the collector layer is configured to have an output current density of at least 100 mA/cm² for operation voltages below 1.5V.

In some embodiments, a method of fabricating a device, comprises: providing a substrate with an emitter layer disposed thereon; spin coating an insulating layer on the emitter layer; modifying the insulating layer by either: disposing a polymer layer atop the insulating layer or etch-treating the insulating layer; coating the insulating layer with polymeric nano-spheres; coating the polymeric nano-spheres with a patterned metal mask layer; removing the polymeric nano-spheres after disposing the patterned metal mask layer to form voids in the insulating layer; coating the patterned metal mask layer with a donor-acceptor organic semiconductor (OSC) layer; and disposing a patterned collector layer on the OSC layer.

In one aspect, which is combinable with any of the other aspects or embodiments, the insulating layer is polyvinylpyrrolidone (PVP).

In one aspect, which is combinable with any of the other aspects or embodiments, the polymer layer is poly(3-hexylthiophene-2,5-diyl) (P3HT) and the etch-treating comprises reactive ion etching (RIE).

In one aspect, which is combinable with any of the other aspects or embodiments, the polymeric nano-spheres comprise polystyrene.

Additional features and advantages will be set forth in the detailed description which follows, and in part will be readily apparent to those skilled in the art from the description or recognized by practicing the embodiments as described in the written description and claims hereof, as well as in the appended drawings.

It is to be understood that both the foregoing general description and the following detailed description are merely exemplary, and are intended to provide an overview or framework for understanding the nature and character of the invention.

BRIEF DESCRIPTION OF THE DRAWINGS

The accompanying drawings are included to provide a further understanding of the description, and are incorporated in and constitute a part of this specification. The drawings are not necessarily to scale, and sizes of various elements may be distorted for clarity. The drawings illustrate one or more embodiment(s) and together with the description serve to explain the principles and operation of the embodiments.

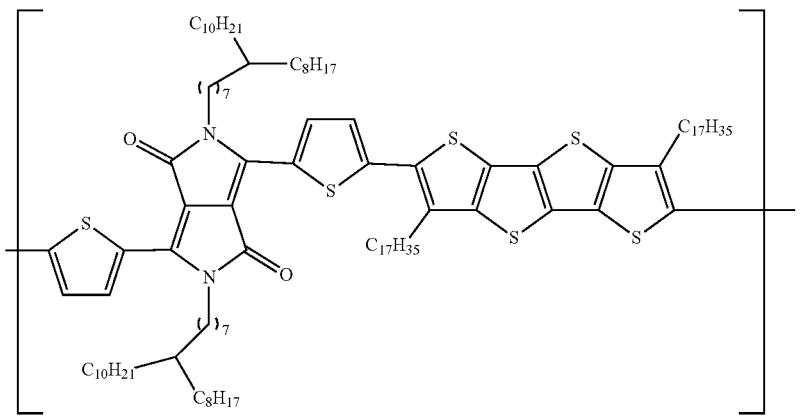

Figure 2A:
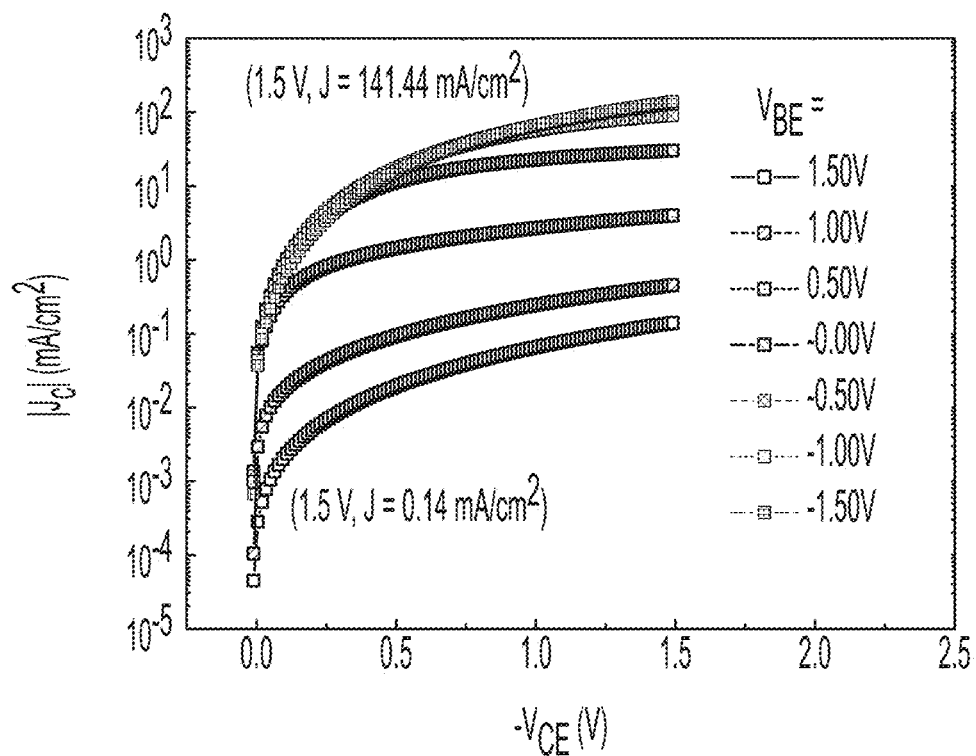
FIGS. 2A and 2B show I-V curves of vertical transistors incorporating embodied polymer.
Figure 2B:
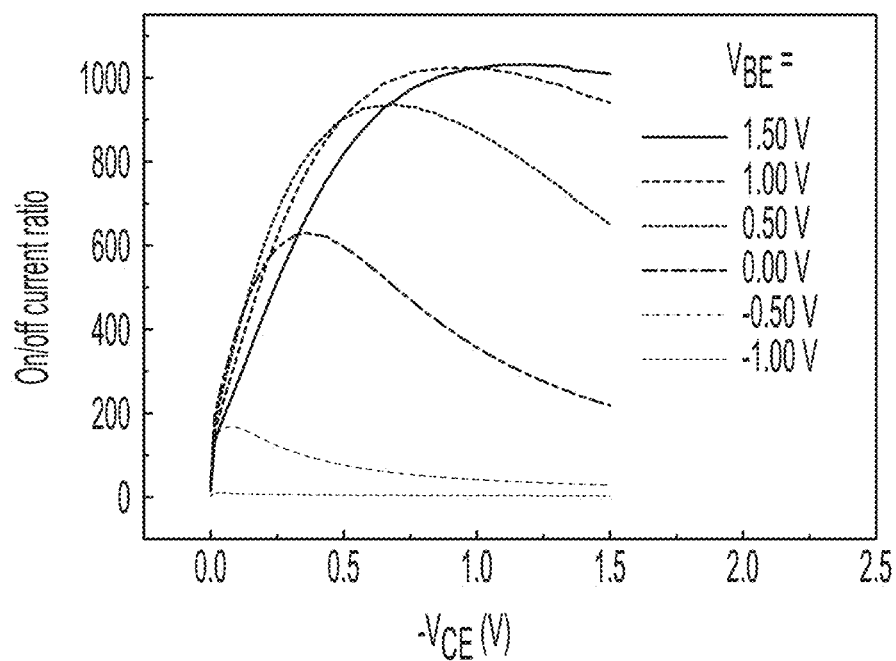

PTDC8BC8C₁ODPPTDC17FT4 in chlorobenzene, with FIG. 2A showing the output characteristics and FIG. 2B showing the on/off current ratio.

Figure 3A:
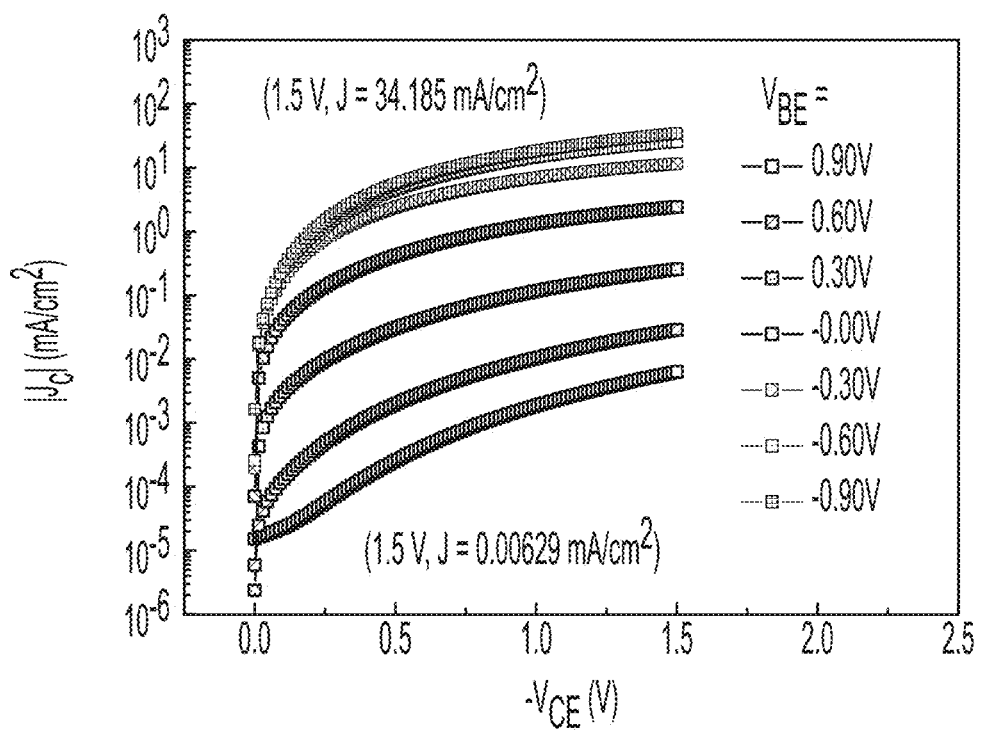
Figure 3B:
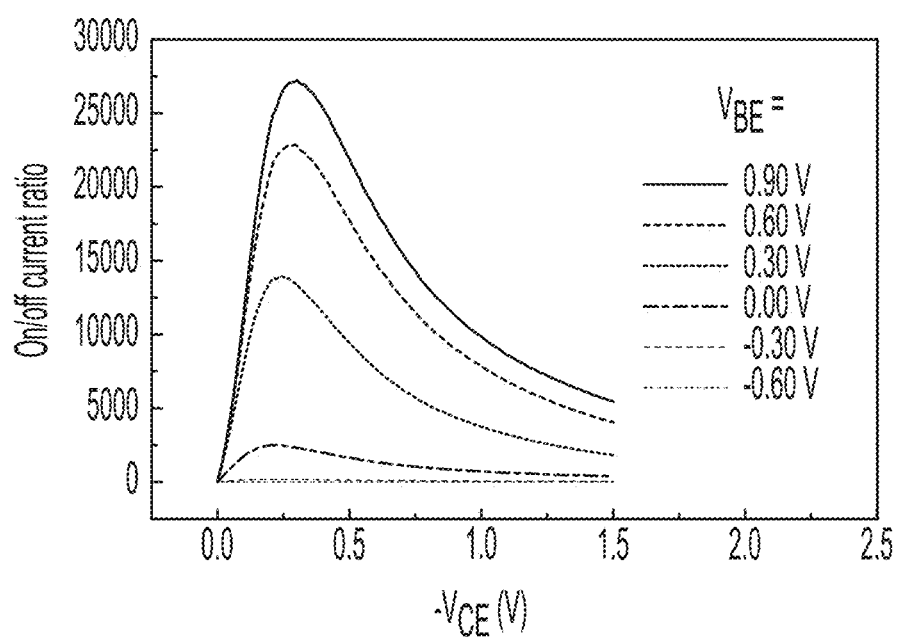

FIGS. 3A and 3B show I-V curves of vertical transistors incorporating PTDC8BC8C10DPPTDC17FT4 in tetraline, with FIG. 3A showing the output characteristics and FIG. 3B showing the on/off current ratio.

Figure 4A:
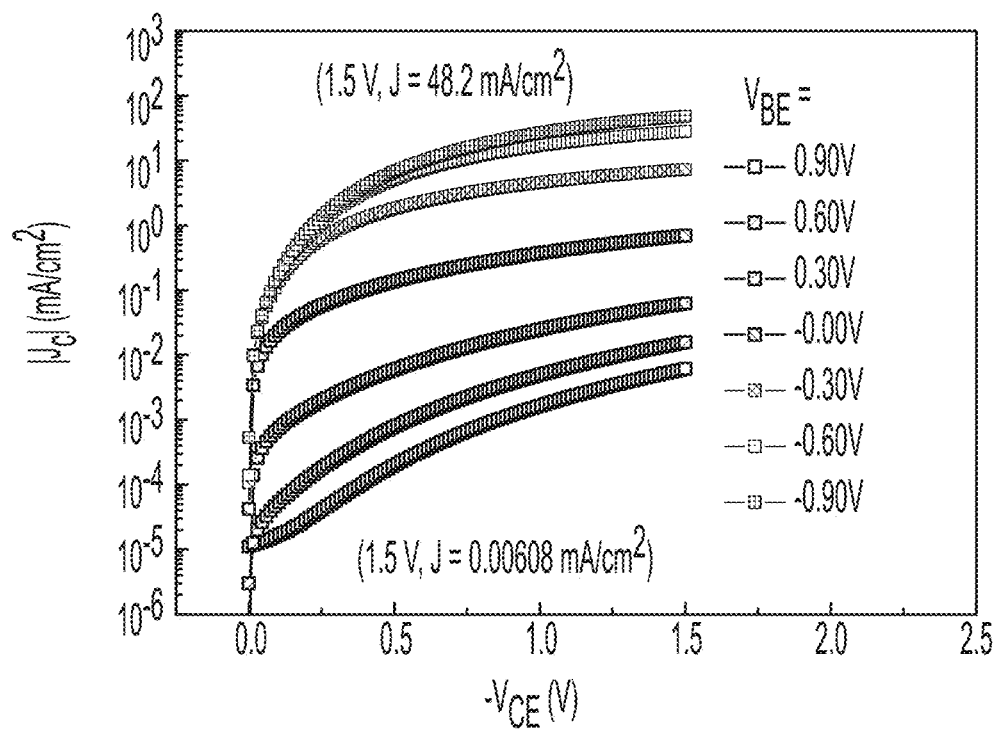
Figure 4B:
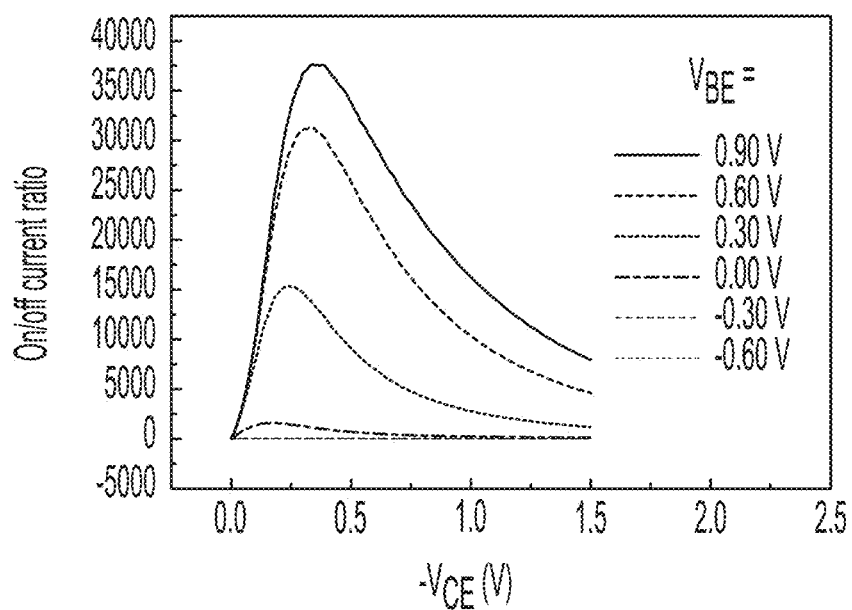

FIGS. 4A and 4B show I-V curves of vertical transistors incorporating PTDC8BC8C10DPPTDC17FT4 in cycloctane, with FIG. 4A showing the output characteristics and FIG. 4B showing the on/off current ratio.

Figure 5A:
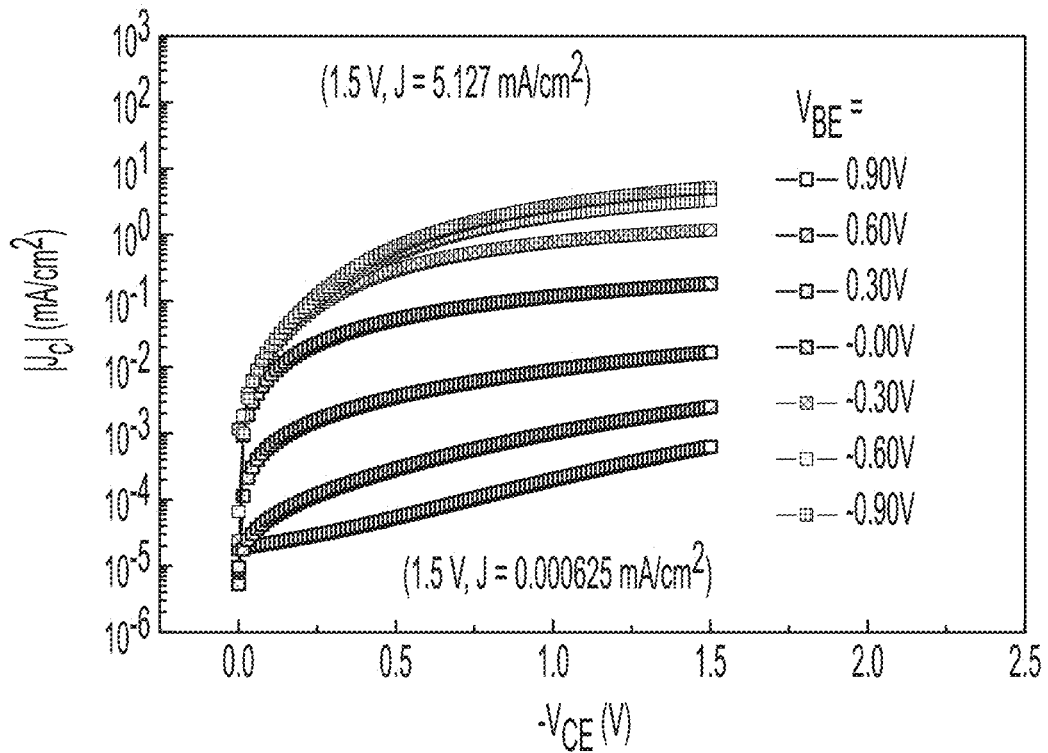
Figure 5B:
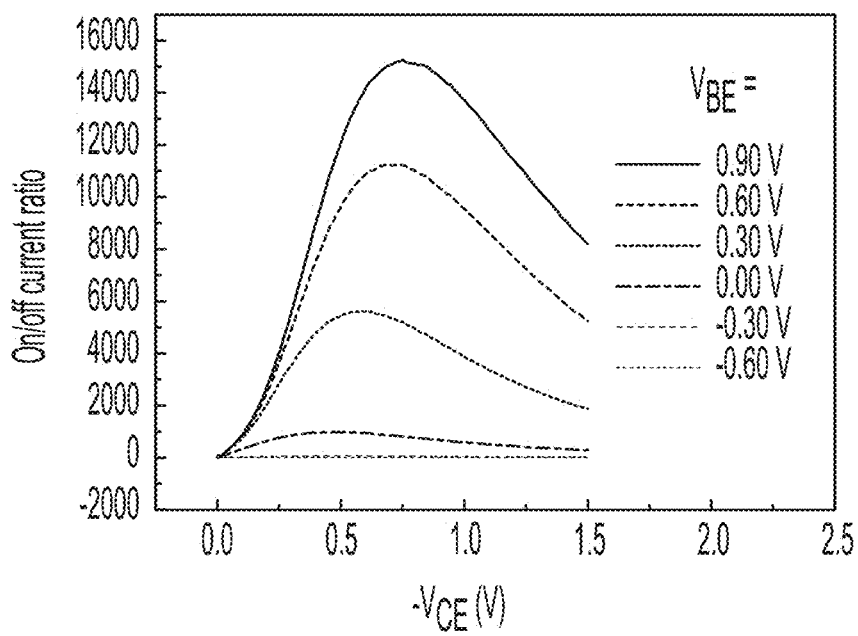

FIGS. 5A and 5B show I-V curves of vertical transistors incorporating PTDC8BC8C10DPPTDC17FT4 in decalin, with FIG. 5A showing the output characteristics and FIG. 5B showing the on/off current ratio.

Figure 6:
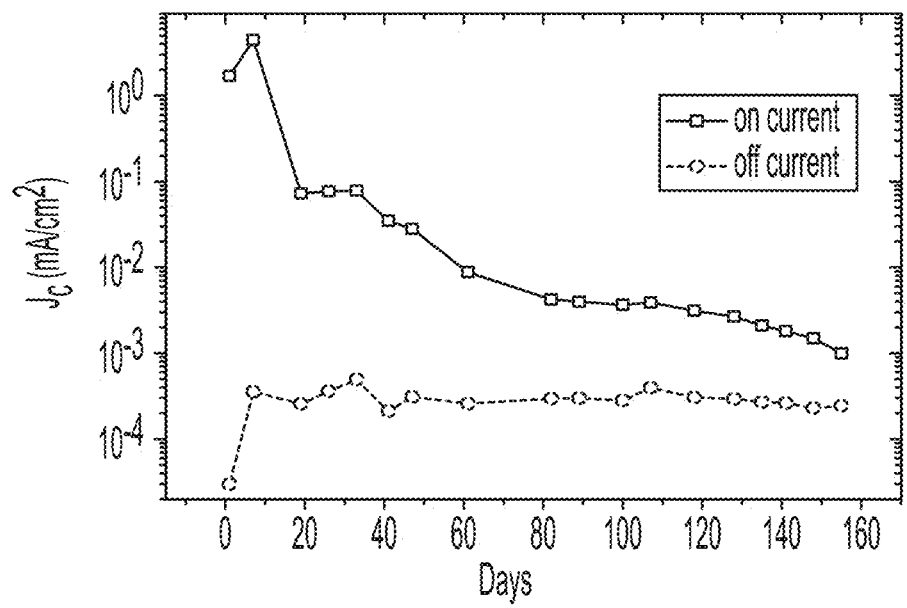

FIG. 6 is a graph showing the lifetime of the vertical transistor characteristics incorporating PTDC8BC8C10DPPTDC17FT4.

Figure 7:
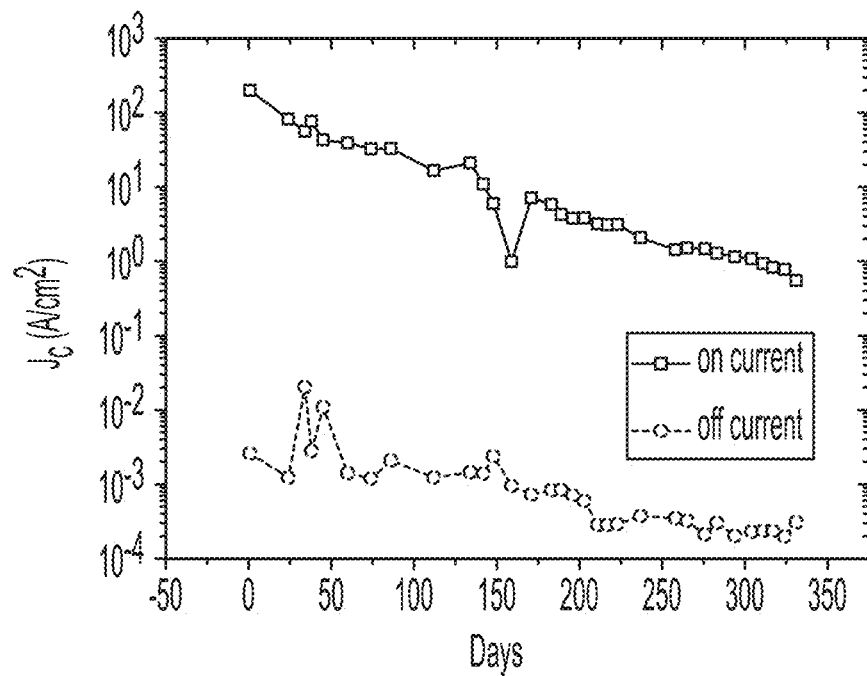

FIG. 7 is a graph showing the Lifetime of the vertical transistor characteristics incorporating:

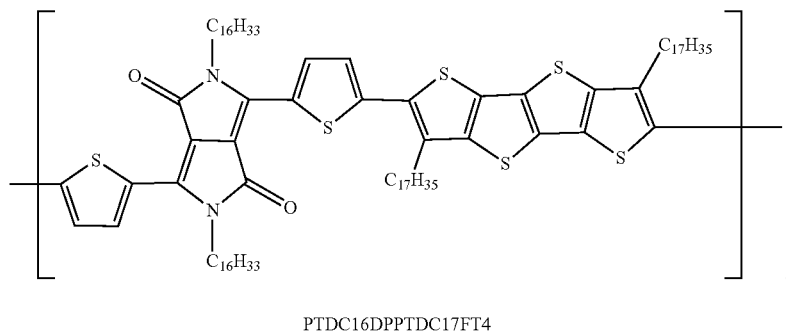

PTDC16DPPTDC17FT4

Figure 8:
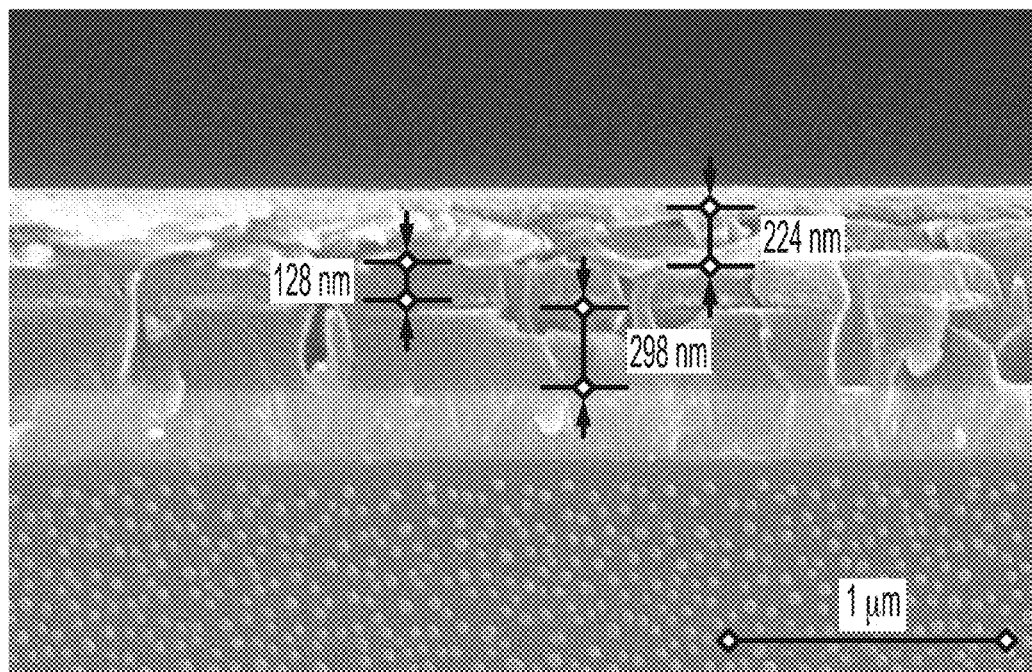

FIG. 8 is a scanning electron microscope (SEM) image of the vertical transistor incorporating PTDC8BC8C₁ODPPTDC17FT4.

Figure 9:
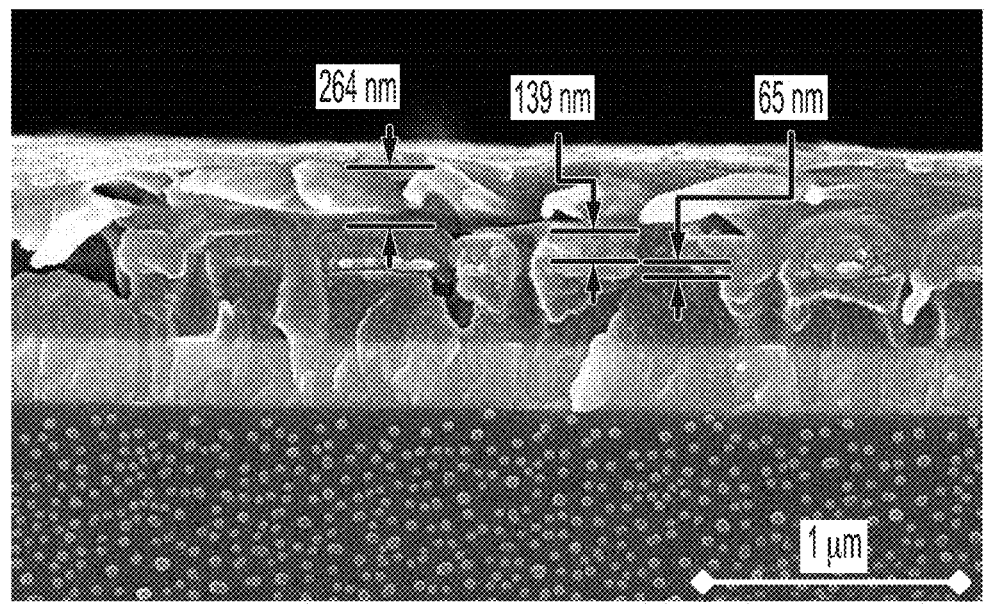

FIG. 9 is a scanning electron microscope (SEM) image of the vertical transistor incorporating PTDC16DPPTDC17FT4.

Figure 10:
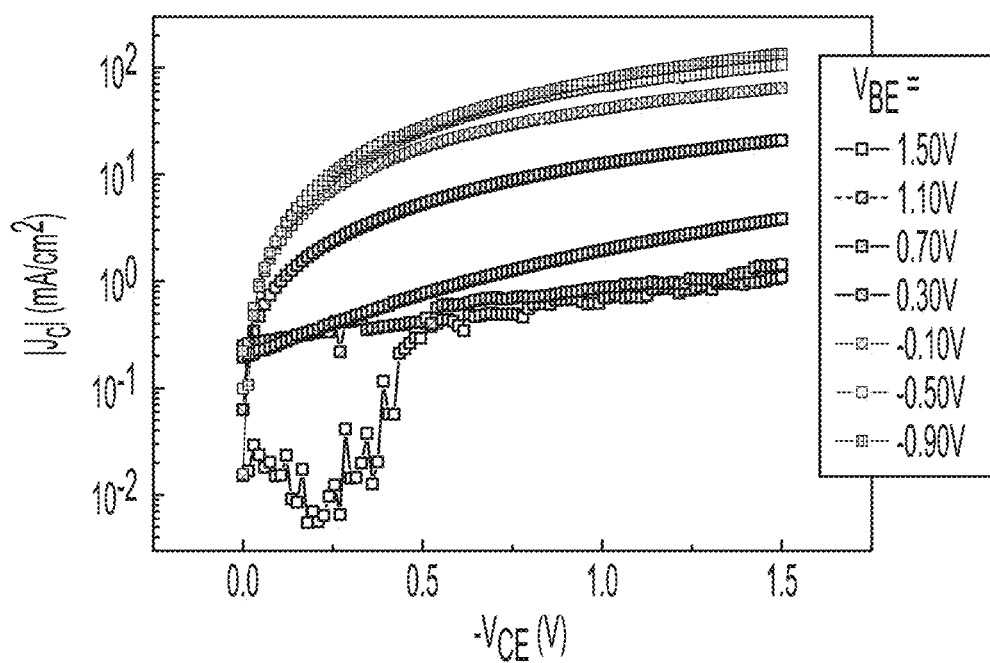

FIG. 10 is a graph showing the output current of the vertical transistor characteristics without poly(3-hexylthiophene-2,5-diyl) (P3HT) interlayer deposited over polyvinylpyrrolidone (PVP).

Figure 11:
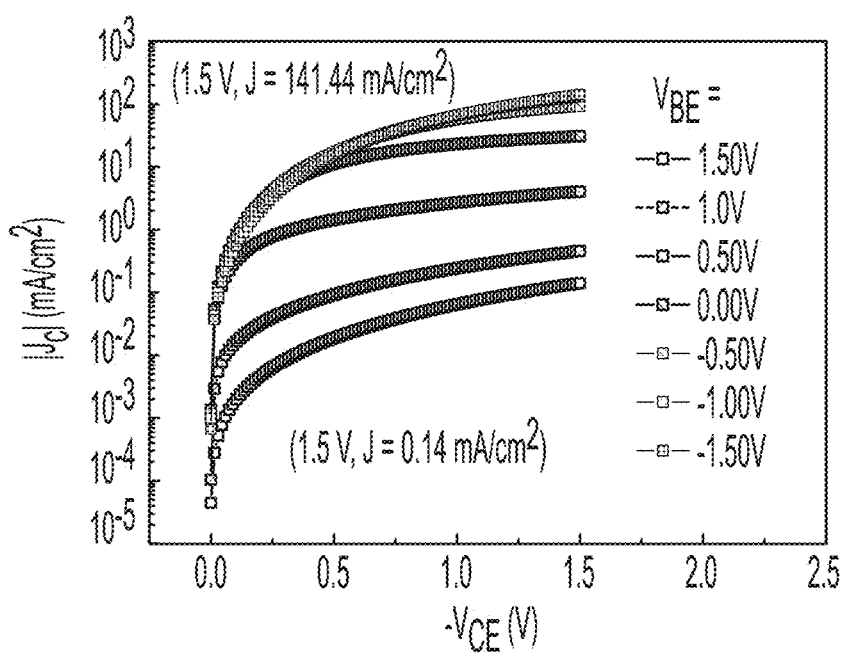

FIG. 11 is a graph showing the output current of the vertical transistor characteristics incorporating:

pounds, synthetic methods, or uses as such may, of course, vary. It is also to be understood that the terminology used herein is for the purpose of describing particular aspects only and is not intended to be limiting.

In this specification and in the claims that follow, reference will be made to a number of terms that shall be defined to have the following meanings:

Throughout this specification, unless the context requires otherwise, the word "comprise," or variations such as "comprises" or "comprising," will be understood to imply the inclusion of a stated integer or step or group of integers or steps but not the exclusion of any other integer or step or group of integers or steps.

It must be noted that, as used in the specification and the appended claims, the singular forms "a," "an" and "the" include plural referents unless the context clearly dictates otherwise. Thus, for example, reference to "a carrier" includes mixtures of two or more such carriers, and the like.

"Optional" or "optionally" means that the subsequently described event or circumstance may or cannot occur, and that the description includes instances where the event or circumstance occurs and instances where it does not.

Where a range of numerical values is recited herein, comprising upper and lower values, unless otherwise stated in specific circumstances, the range is intended to include the endpoints thereof, and all integers and fractions within the range. It is not intended that the scope of the claims be

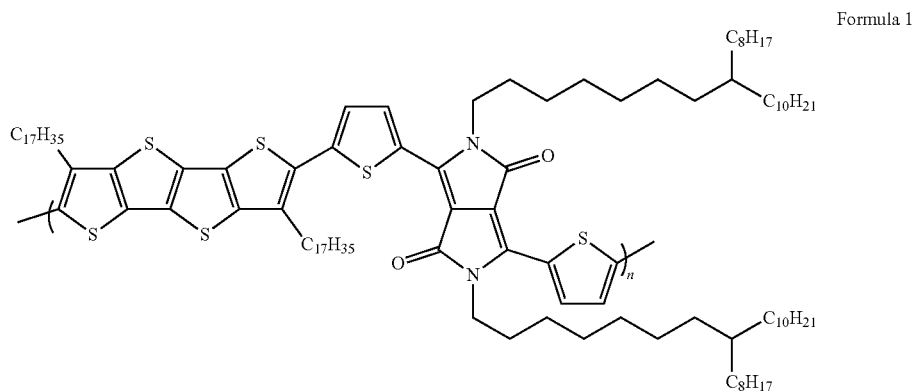

Formula 1

DETAILED DESCRIPTION

Before the present materials, articles, and/or methods are disclosed and described, it is to be understood that the aspects described below are not limited to specific comlimited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed.

When the term "about" is used in describing a value or an end-point of a range, the disclosure should be understood to include the specific value or end-point referred to. When a numerical value or end-point of a range does not recite "about," the numerical value or end-point of a range is intended to include two embodiments: one modified by "about," and one not modified by "about." It will be further understood that the endpoints of each of the ranges are significant both in relation to the other endpoint, and independently of the other endpoint.

The term "alkyl group" as used herein may be a branched or unbranched saturated hydrocarbon group of 1 to 40 carbon atoms (or with a number of carbon atoms as defined by the nomenclature $C_\square$-$C_\square$, where $\square$ and $\square$ are a numerical values with $\square<\square$), such as methyl, ethyl, n-propyl, isopropyl, n-butyl, isobutyl, t-butyl, pentyl, hexyl, heptyl, octyl, decyl, or tetradecyl, and the like. The alkyl group may be substituted or unsubstituted when not specifically limited. The term "unsubstituted alkyl group" is defined herein as an alkyl group composed of just carbon and hydrogen. The term "substituted alkyl group" is defined herein as an alkyl group with one or more hydrogen atoms substituted with a "substituent" consisting of $C_1$-$C_{20}$ alkyl, $C_1$-$C_{20}$ alkenyl, $C_1$-Cao alkynyl, $C_3$-Cao cycloalkyl, halogen, hydroxy, $C_6$-$C_{20}$ aryl, $C_6$-$C_{20}$ heteroaryl, alkoxy, carboxy, carboxylic acid, cyano, or heterocyclyl. Unless otherwise constrained by the definition, all substituents may optionally be further substituted by 1, 2, or 3 substituents chosen from $C_1$-Cao alkyl, hydroxy, halogen, or $CF_3$.

The term "alkyl group" as defined herein also includes cycloalkyl, which may be optionally substituted with a substituent as defined above. The term "cycloalkyl group" as used herein is a non-aromatic carbon-based ring composed of at least 3 carbon atoms, and in some embodiments from 3 to 20 carbon atoms. Examples of cycloalkyl groups include, but are not limited to, cyclopropyl, cyclobutyl, cyclopentyl, cyclohexyl, etc. The term cycloalkyl group also includes a heterocycloalkyl group, where at least one of the carbon atoms of the ring may be substituted with a heteroatom such as, but not limited to, nitrogen, oxygen, sulfur, or phosphorus.

The term "aryl group" as used herein may be any carbon-based aromatic group, fused carbon-based aromatic group, including, but not limited to, benzene, naphthalene, etc. The term "aryl group" also includes "heteroaryl group," meaning an aromatic ring composed of at least three carbon atoms that has at least one heteroatom incorporated within the ring of the aromatic group. Examples of heteroatoms include, but are not limited to, nitrogen, oxygen, sulfur, and phosphorus. The aryl group may be substituted or unsubstituted. The aryl group may be substituted with one or more groups including, but not limited to, $C_1$-Cao alkyl, $C_1$-Cao alkynyl, $C_1$-Cao alkenyl, halo, nitro, amino, or hydroxyl. In some embodiments, the term "aryl group" may be limited to substituted or unsubstituted aryl and heteroaryl rings having from 6 to 40 carbon atoms.

The term "halogen" or "halo" refers to a fluoro, bromo, chloro, or iodo group.

The term "alkenyl group" is defined as a branched or unbranched hydrocarbon group of 2 to 40 carbon atoms and structural formula containing at least one carbon-carbon double bond, and which may be optionally substituted in the same way as an alkyl group. The term "alkenyl group" as defined herein also includes "cycloalkenyl," which may be optionally substituted with a substituent as defined above. The term "cycloalkenyl" refers to carbocyclic groups of from 3 to 20 carbon atoms having a single cyclic ring or multiple condensed rings with at least one double bond in the ring structure.

The term "alkynyl group" is defined as a branched or unbranched hydrocarbon group of 2 to 40 carbon atoms and a structural formula containing at least one carbon-carbon triple bond, and which may be optionally substituted in the same way as an alkyl group.

The term "conjugated group" is defined as a linear, branched or cyclic group, or combination thereof, in which p-orbitals of the atoms within the group are connected via delocalization of electrons and wherein the structure may be described as containing alternating single and double or triple bonds and may further contain lone pairs, radicals, or carbenium ions. Conjugated cyclic groups may comprise one of or both aromatic and non-aromatic groups, and may comprise polycyclic or heterocyclic groups, such as diketopyrrolopyrrole. Ideally, conjugated groups are bound in such a way as to continue the conjugation between the thiophene moieties they connect. In some embodiments, "conjugated groups" may be limited to conjugated groups having 3 to 30 carbon atoms.

"PTDC16DPPTDC17FT4" as used herein is a shorthand or coded designation for the polymer structure:

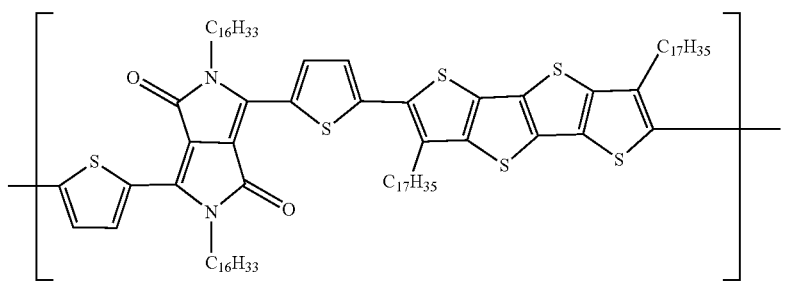

representing in order of occurrence from right to left: the "P" is a polymer comprised of one "T" or thiophene unit, the "DC16DPP" is a diketopyrrolopyrrole (DPP) having N,N'-substitutents of two $C_{16}H_{33}$ groups, "T" is for an intervening thiophene, DC17FT4 for a fused thiophene having four fused rings (FT4) and having two $C_{17}H_{35}$ groups or chains as β-substituents or on the β positions of the FT4 portion.

"PTDC8BC8C$_1$ODPPTDC17FT4" as used herein is a shorthand or coded designation for the polymer structure:

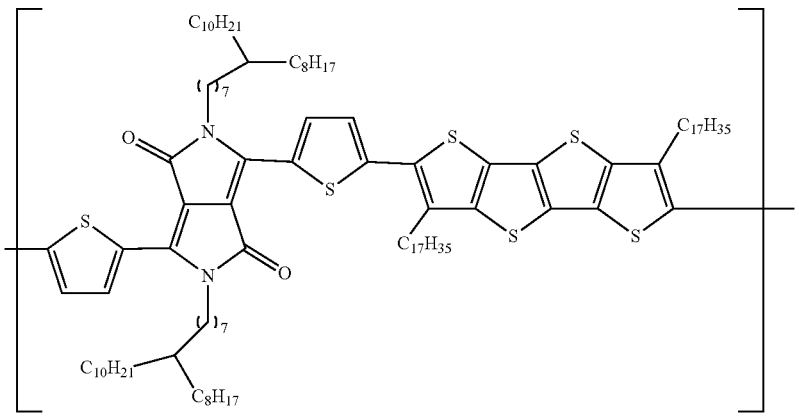

representing in order of occurrence from right to left: the "P" is a polymer comprised of one "T" or thiophene unit, the "DC8BC8C$_1$ODPP" is a diketopyrrolopyrrole (DPP) having N,N'-substitutents of two C$_8$E115(C$_8$H$_{17}$C$_{10}$H21) groups, "T" is for an intervening thiophene, "DC17FT4" for a fused thiophene having four fused rings ("FT4") and having two C$_{17}$H$_{35}$ groups or chains as β-substituents or on the β positions of the FT4 portion.

"P2TDC8BC8C10DPP2TDC9BC8C10FT4" as used herein is a shorthand or coded designation for the polymer structure:

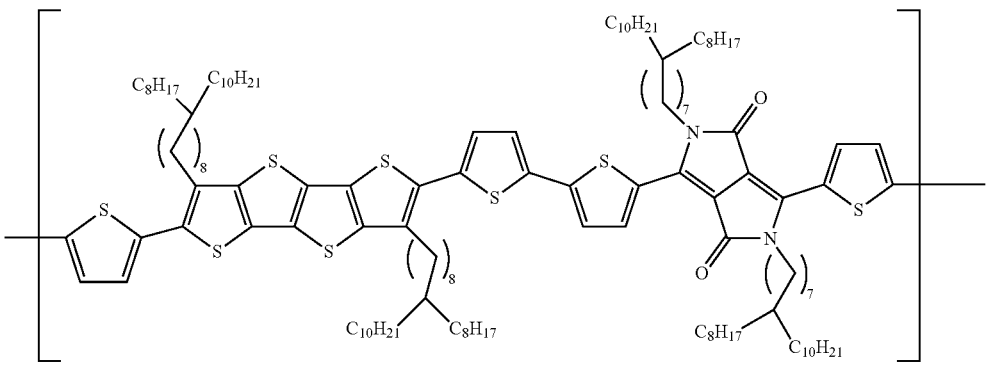

representing in order of occurrence from right to left: the "P" is a polymer comprised of two "T's" or thiophene units, the "DC8BC8C10DPP" is a diketopyrrolopyrrole (DPP) having N,N'-substitutents of two C$_8$H$_{15}$(C$_8$H$_{17}$C$_{10}$H$_{21}$) groups, "2T" is for an intervening two thiophenes, "DC9BC8C$_{10}$" for a fused thiophene having four fused rings ("FT4") and having two C$_9$H$_{17}$(C$_8$H$_{17}$C$_{10}$H$_{21}$) groups or chains as β-substituents or on the β positions of the FT4 portion.

Disclosed are devices incorporating donor-acceptor polymeric compounds along with methods of making. It is understood that while combinations, subsets, interactions, groups, etc. of these materials are disclosed, it may be the case that while specific reference of each and every various individual and collective combination and permutation of these compounds may not be explicitly disclosed, all combinations and permutations are specifically contemplated and incorporated herein. Thus, if a class of molecules A, B, and C are disclosed as well as a class of molecules D, E, and F and an example of a combination molecule, A-D may be disclosed, then even if each is not individually recited, each may be individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these may be also specifically contemplated and disclosed. Thus, for example, the subgroup of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that may be performed it may be understood that each of these additional steps may be performed with any specific embodiment or combination of embodiments of the disclosed methods, and that each such combination may be specifically contemplated and should be considered disclosed.

Compounds

Presented herein are conjugated polymeric compounds that may be used in vertical transistors, and electronic devices incorporating such transistors. The compounds may be easily synthesized and may be solution processable.

Accordingly, transistors incorporating these compounds may be manufactured using solution deposition techniques such as inkjet printing, dip and/or spin coating, and screen printing, to name a few.

The compounds described herein contain alternating blocks of aromatic, heteroaromatic or ethenylene electron accepting groups ("A" groups, also referred to as electron withdrawing groups or electron accepting groups), which are referred to as acceptor blocks, and blocks of aromatic or heteroaromatic electron-rich donating groups ("D" groups, also referred to as electron donating groups), which are referred to as donor blocks, along a compound backbone. The acceptor blocks contribute to the electron transport, while the donor blocks contribute to the hole transport.

The repeating unit of the polymeric compounds contains an acceptor block containing one or more acceptor groups (A) with a donor block containing one or more donor groups (D) on each side of the acceptor group, thus providing the general formula I:

(I)

where a and b are integers from 1 to 4 and n is an integer from 2 to 10,000, each D is an independently selected conjugated electron donating aromatic or heteroaromatic group having from 5 to 50 backbone atoms, each D group optionally substituted with one or more electron donating substituents or electron withdrawing substituents, provided that even when substituted the electronic character of each D is electron donating; each A is an independently selected conjugated electron accepting aromatic or heteroaromatic group having from 5 to 50 backbone atoms or an ethenylene group substituted with one or two electron withdrawing substituents, each A being optionally substituted with one or more electron donating substituents or electron withdrawing substituents provided that even when substituted the electronic character of each A is electron accepting.

In some embodiments, each D is independently one or more of the following:

TABLE 1

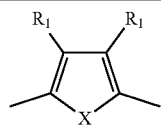

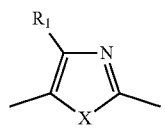

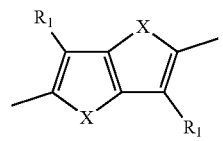

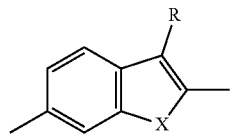

TABLE 1-continued

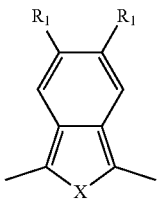

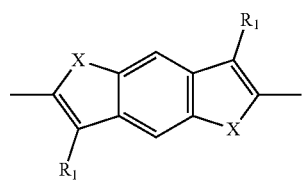

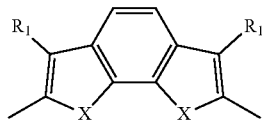

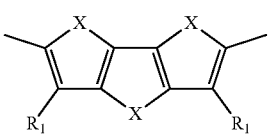

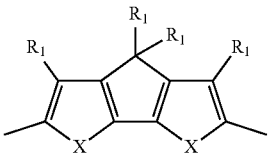

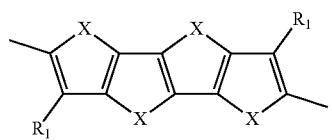

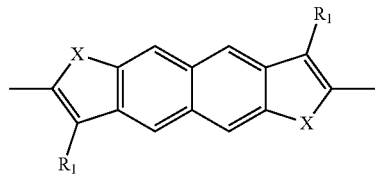

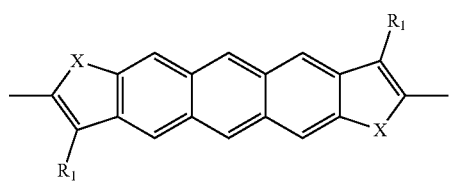

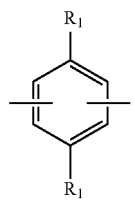

TABLE 1-continued

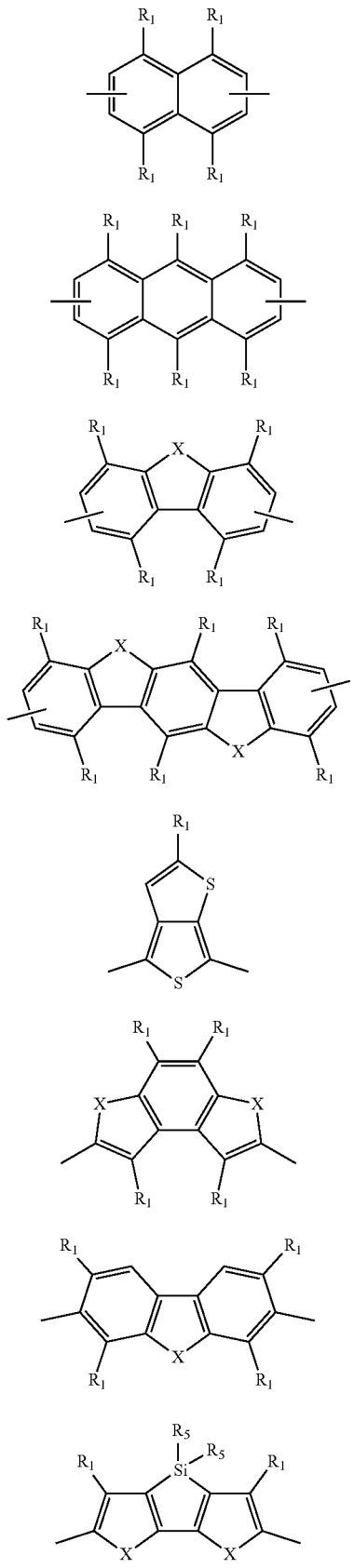

TABLE 1-continued

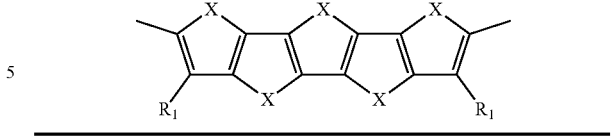

where each x is independently $NR_6$, S, Se, or O; each $R_1$ is independently hydrogen, $C_1$-$C_{40}$ alkyl, $C_1$-$C_{40}$ alkenyl, $C_1$-$C_{40}$ alkynyl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo; each $R_5$ is independently hydrogen, $C_1$-$C_{40}$ alkyl, $C_1$-$C_{40}$ alkenyl, $C_1$-$C_{40}$ alkoxy, $C_1$-$C_{40}$ cycloalkyl, $C_1$-$C_{40}$ aryl, $C_1$-$C_{40}$ heteroaryl, or $C_1$-$C_{40}$ conjugated group, any of which may be optionally substituted; and each $R_6$ is independently hydrogen, $C_1$-$C_{40}$ alkyl.

In some embodiments, each A is independently one or more of the following:

TABLE 2

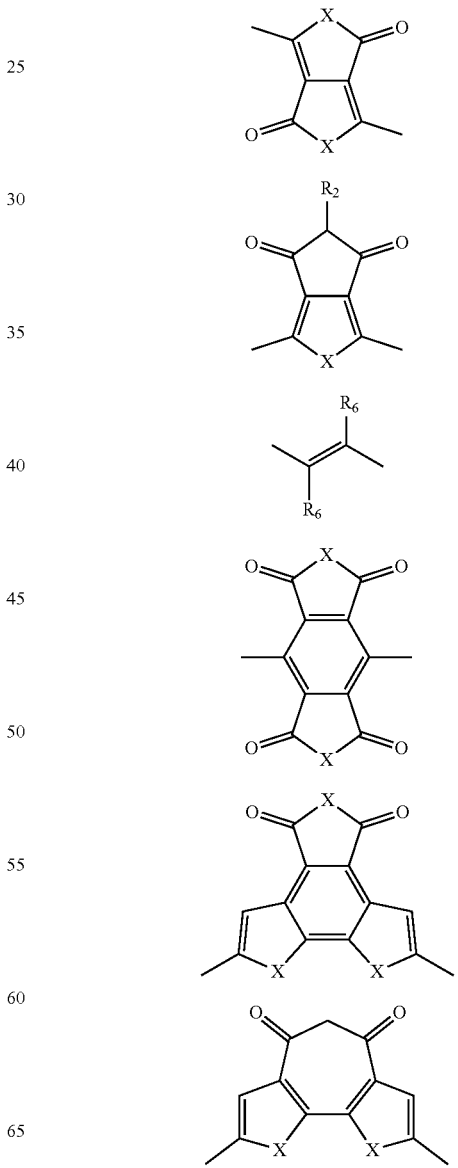

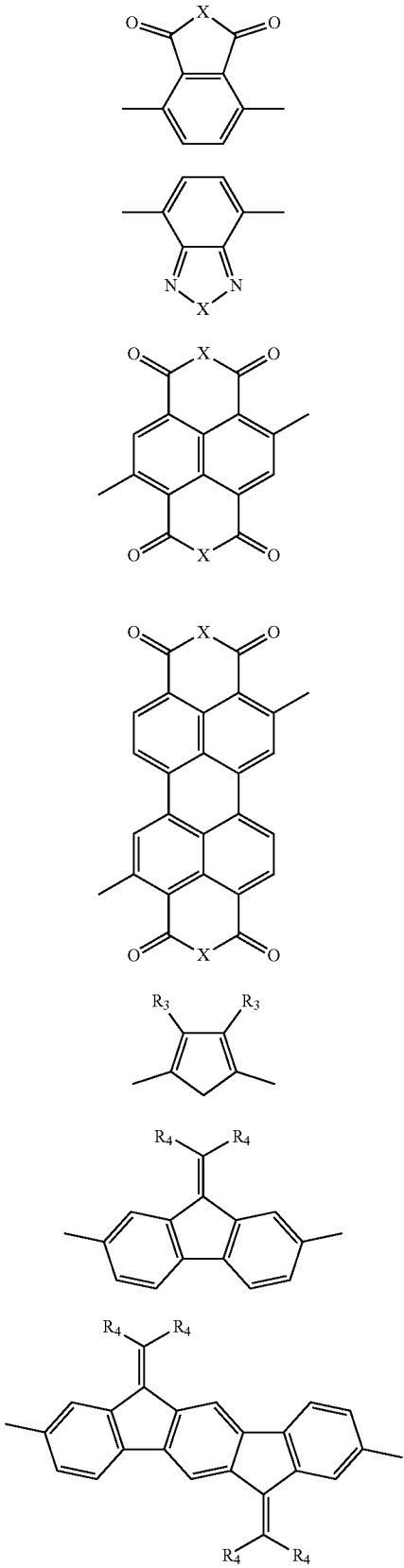

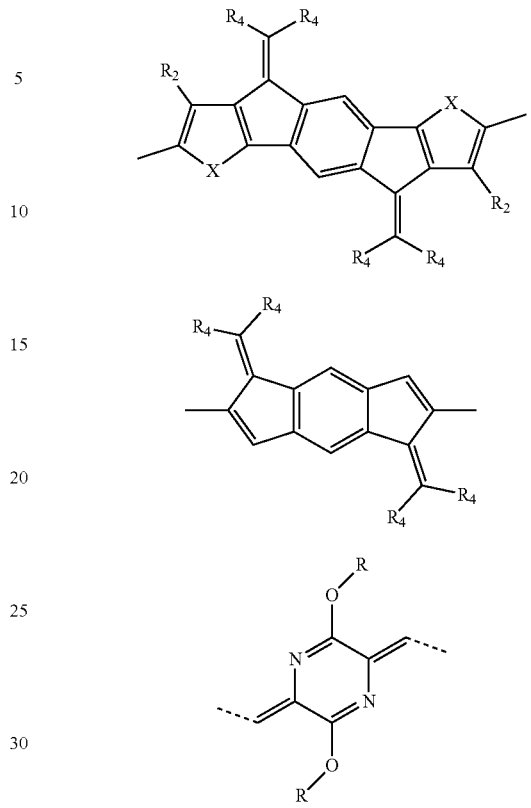

where each x is independently $NR_5$, S, Se, or O; each $R_2$ is independently hydrogen, $C_1$-$C_{40}$ alkyl, $C_1$-$C_{40}$ alkenyl, $C_1$-$C_{40}$ alkynyl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo; each $R_3$ is independently hydrogen, $C_1$-$C_{40}$alkyl, $C_1$-$C_{40}$ alkenyl, $C_1$-$C_{40}$ alkoxy, $C_1$-$C_{40}$ cycloalkyl, $C_1$-$C_{40}$ aryl, $C_1$-$C_{40}$ heteroaryl, or $C_1$-$C_{40}$ conjugated group, any of which may be optionally substituted; each $R_5$ is independently hydrogen, $C_1$-$C_{40}$ alkyl; each $R_4$ is independently hydrogen, $C_1$-$C_{40}$alkyl, cyano, ester, or carboxylic acid, and each $R_6$ is independently hydrogen, $C_1$-$C_{40}$alkyl, cyano, ester, or carboxylic acid.

The side chains, $R_1$, $R_2$, $R_3$, $R_4$, and $R_6$ can play a significant role in the solubility, stability, or film forming properties (including structure, adhesion, organization, precessability, and the like) of the polymers. In some embodiments, one or more of $R_1$, $R_2$, $R_3$, $R_4$, and $R_6$ is an optionally substituted $C_{15}$-$C_{35}$ alkyl. In some embodiments, one or more of $R_1$, $R_2$, $R_3$, or $R_4$ is an optionally substituted $C_{15}$-$C_{35}$ alkyl having at least one branching point. In particular, one or more of $R_1$, $R_2$, or $R_3$ can be optionally substituted $C_{15}$-$C_{35}$ alkyl. In some embodiments, each $R_1$ or $R_2$ is independently an optionally substituted $C_{15}$-$C_{35}$ alkyl. In some embodiments, each $R_1$ or $R_2$ is independently an optionally substituted $C_{15}$-$C_{35}$ alkyl having at least one branching point. In some embodiments each $R_1$ or $R_2$ is independently an optionally substituted $C_{15}$-$C_{35}$ alkyl having at least one branching point, where the branching point is at least 4 carbons from the base molecule.

While it may be expected that the large, branched alkyl side chains would inhibit stacking or structured organization of the polymer, these potential issues have not been observed. Rather, it is hypothesized that the embodied polymers provide superior properties when branched alkyl chains are at least four carbons away from the main polymer backbone, thereby producing no or very low steric effect, which would interfere with the 7c-stacking of the polymer backbones, and the existence of four large, nonpolar branched side chains in one polymer repeat unit significantly increases the solubility of these polymers, thus allowing for an increase in the molecular weight of the polymers, which may result in an enhanced mobility over current high performance polymers. In some embodiments, the polymers have molecular weights of from about 30-80 kDa or 40-60 kDa.

Example embodied donor-acceptor structures are shown in below, wherein n is an integer from 2 to 10,000:

TABLE 3

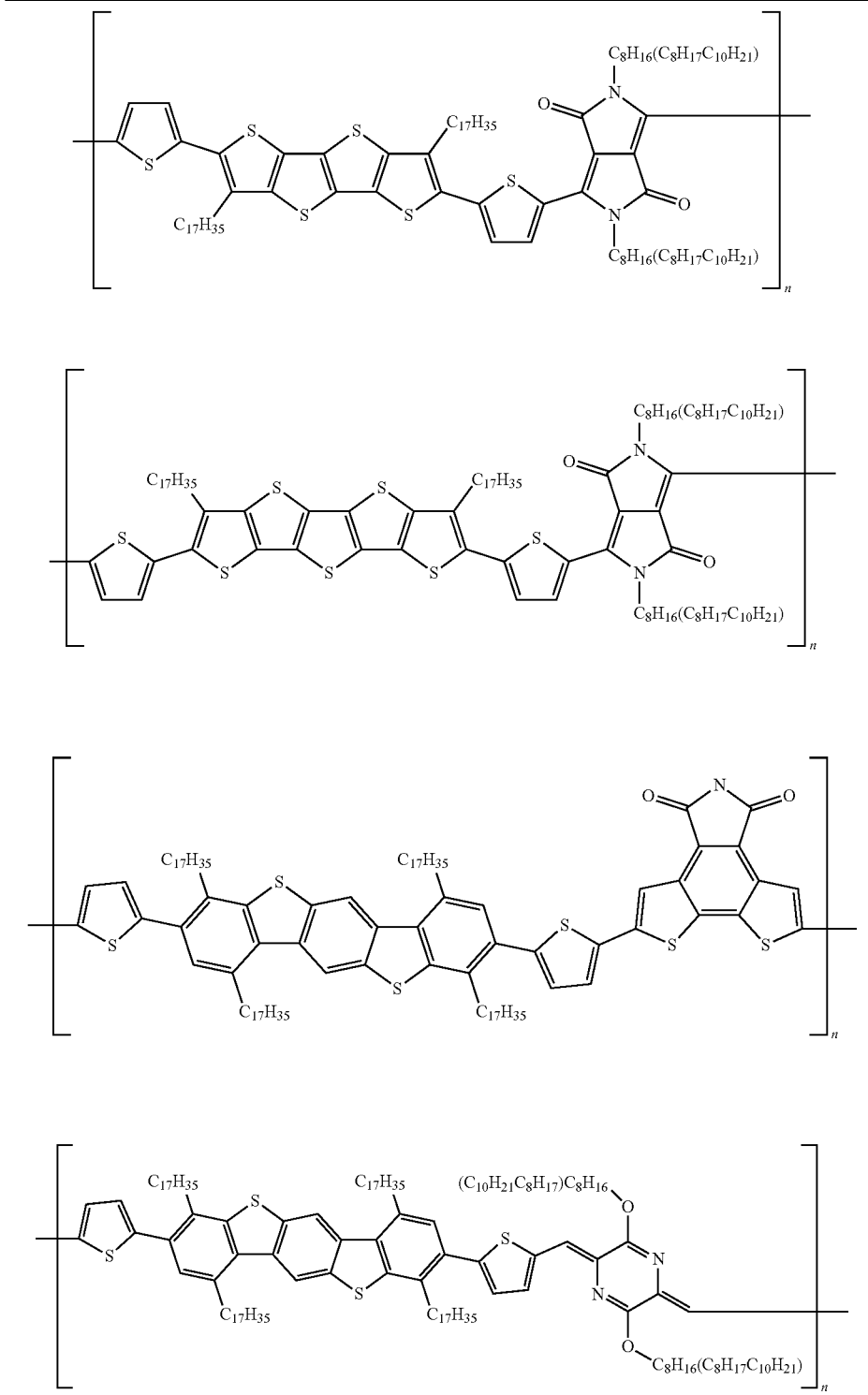

TABLE 3-continued
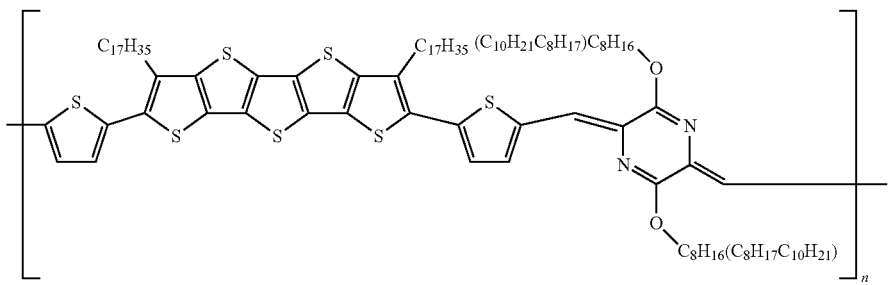
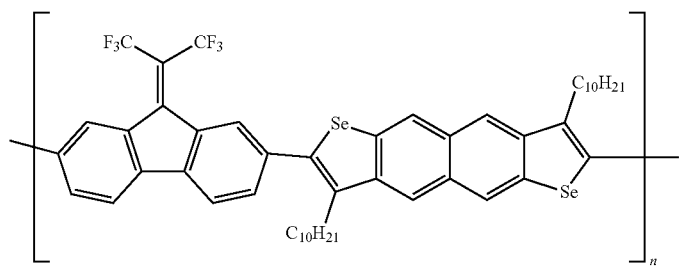
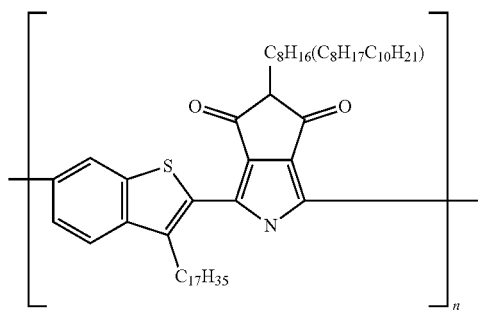
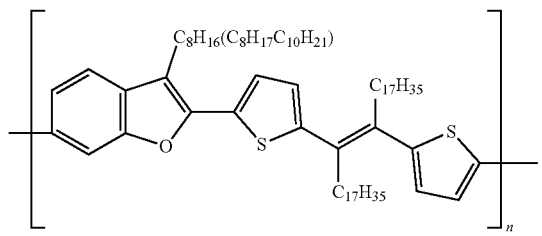
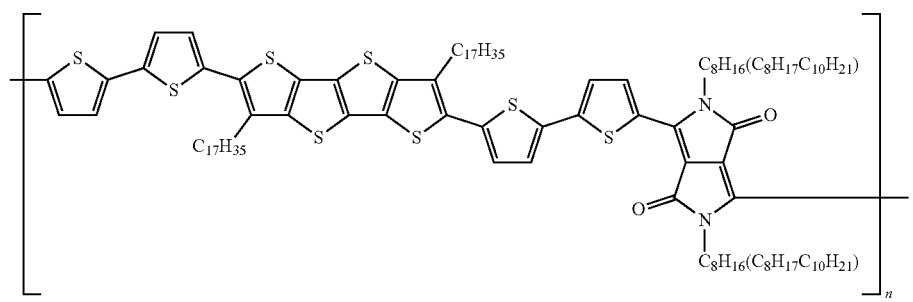

TABLE 3-continued

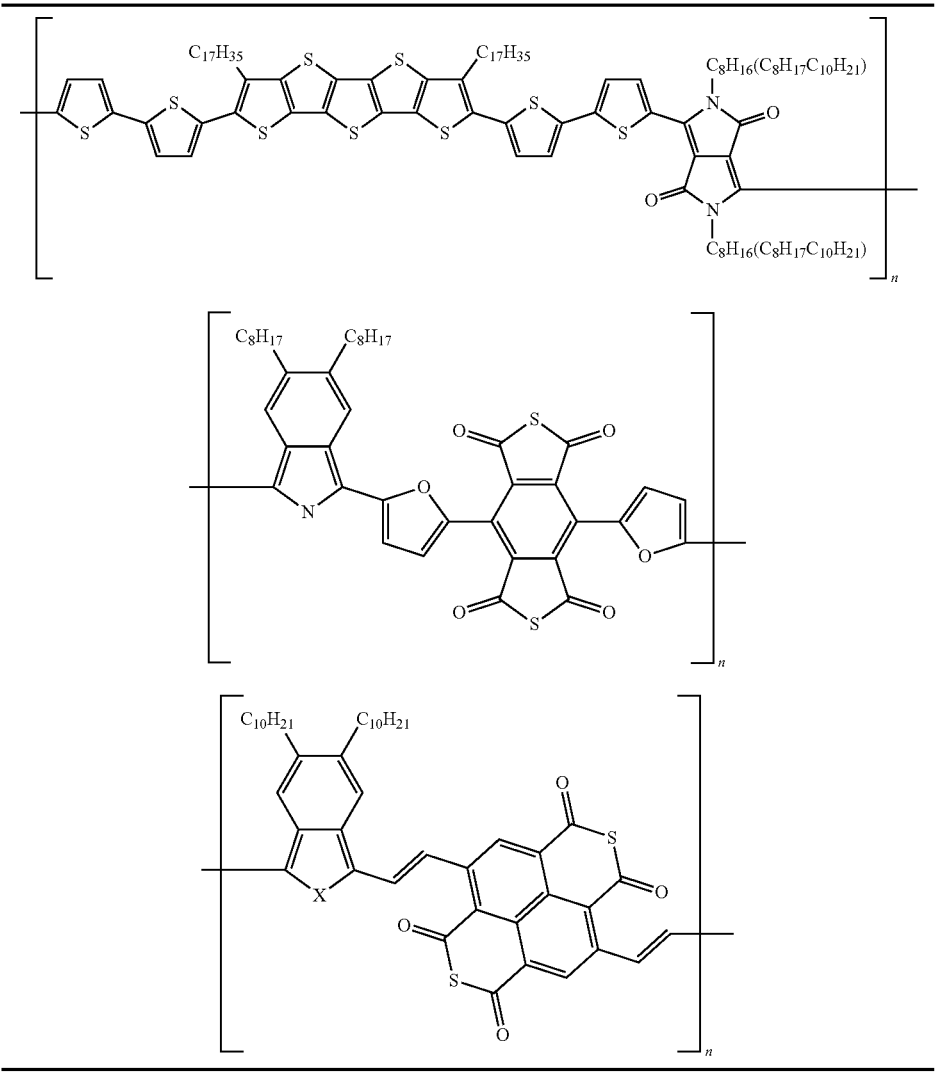

Devices

An organic vertical transistor is similar to a solid-state version of a vacuum tube triode. The vacuum tube triode consists of the cathode for electron emission by heating, the anode for electron collection, and the grid for current modulation. The anode is always positively biased against the cathode. In a vacuum tube triode, both the grid and anode electrodes can control the potential within the device, but the grid is much more effective in controlling the gradient near the cathode. The on and off state of the vacuum tube triode is determined by whether the emitted electrons encounter a large energy barrier between cathode and anode or not. When the grid is in large and negative bias, the electrons experience a negative gradient of potential after they are emitted from cathode, and consequently very few of them can be collected by the anode. However, if the grid is slightly negative biased or positively biased, it is possible for the electrons to find a passage through the potential minimum in the grid.

Figure 1:
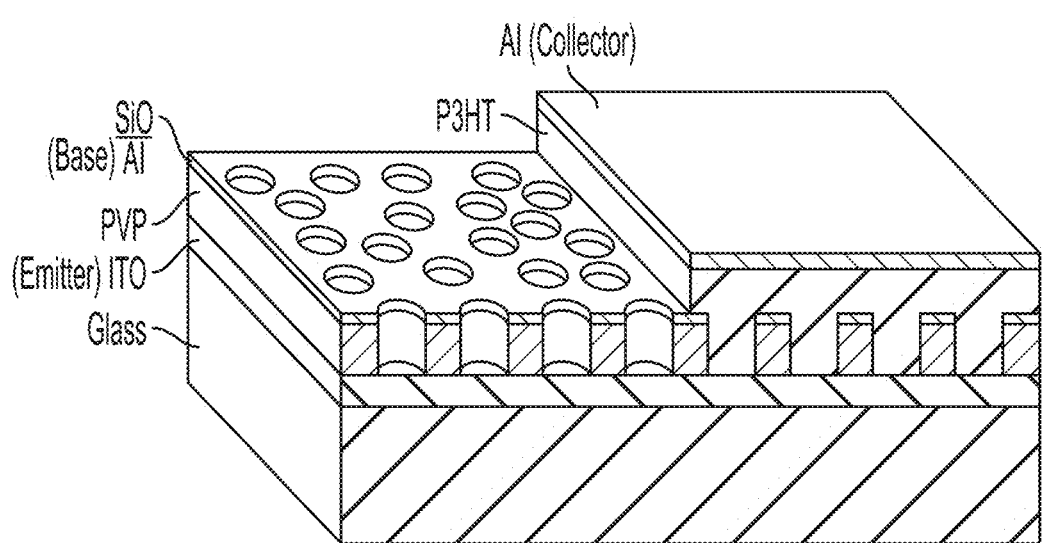
FIG. 1 describes an embodied device design for an organic polymer-based vertical transistor.

An example organic vertical transistor design that function similar to the vacuum tube triodes is shown in FIG. 1. The device is on an inert substrate, such as glass or polymer. Ultrathin (less that 150 or 100 □m for example) and flexible glasses can be used to allow the device to placed in a variety of locations. Electrons are injected from the emitter, going through the openings on the metal grid and finally arriving at the collector. The collector can be a metals, alloys, or metal oxide capable of properly operating at the voltages and currents of the device. Example materials that can be used include Al, Au, Ag, Pt, Cu, and stainless steel. The emitter can have a thickness of 10 nm or greater, for example 10 nm to 500 nm, with the thickness being dictated by the material, signal, current and voltage.

The metal grid can similarly be made of metals capable of properly operating at the voltages and currents of the device, such as Al, Au, Ag, Pt, Cu, and stainless steel. In some embodiments, the metal grid and collector are made of the same material. The metal grid can have a thickness of 10 nm or greater, for example from 10 nm to 200 nm, with the thickness being dictated by the material, the size of the passages through the grid, current and voltage.

The emitter may be a metal, metal oxide, or polymer with a thickness from 10 nm to 500 nm, again dictated by the material, signal, current and voltage. Example materials for the emitter poly(3,4-ethylenedioxythiophene):poly(styrenesulfonate) (PEDOT:PSS), transparent conductive oxides such as indium tin oxide (ITO), and metals such as Cu, Pt, Au, Ag, and the like.

The potential between emitter and collector can be controlled by the voltages of grid and collector. When the voltages of the grid and collector constitute a high barrier between the emitter and the opening, few carriers can arrive at the collector through the openings. On the other hand, if there is no barrier the carriers can go through the opening and reach the collector. The magnitude of the collector current is determined by the space-charge-limited current given by the potential difference between the emitter and the center of the opening. Collector current is modulated by the grid bias which controls the effective potential at the opening for fixed emitter and collector potentials.

For vertical transistors, the output current density is proportional to the vertical mobility according to the space-charge-limited current relation:

$$J_{SCLC}=(9/8)\varepsilon_0\varepsilon_r\mu(V^2/L^3).$$

The advantages of using a donor-acceptor organic semiconductor material in such a system are that the material generates a high current density and high mobility and is highly stable (long shelf life), allowing for simplification of the devices because they can be made without need of an encapsulating layer. Further, many of the polymers can be made efficiently in using non-toxic processes at high purities and high molecular weights (up to 120,000 Da), and with solvent-based printing processes that produce a uniformly thin semiconducting layer.

As shown herein, use of high performance donor-acceptor type of organic semiconductors provides some distinct advantages when combined with this unique vertical transistor structure. The operation voltages for the vertical transistor can be 2V or less, 1.5V or less, 1.25V or less or 1V or less. The donor-acceptor based vertical transistor can have current densities of 80 mA/cm$^2$, 90 mA/cm$^2$, 100 mA/cm$^2$, 110 mA/cm$^2$, 120 mA/cm$^2$, 130 mA/cm$^2$, 140 mA/cm$^2$, 150 mA/cm$^2$, or 160 mA/cm$^2$. Because there is no need for an encapsulation layer, the device fabrication process is simpler and scalable for large area requiring a little as two mask levels and allowing for the use of a variety of hydrocarbon solvents.

In particular, the vertical transistor provides a unique design that allows for high amplification and improves sensitivity of organic semiconductors in senor applications. In the vertical transistor design, device current is through the bulk material and is not hampered by surface effects like normal field mobility degradation or proximity doping effects as in FETs. Further, the vertical design encapsulates the OSC, thus enhancing the stability of the device and OSC material. Finally, the vertical OSC transistor occupies a much smaller in footprint than a traditional device such as a FET. A planar FET would need to be ~150X to 200X the footprint size to achieve the same current output.

Methods

Another aspect comprises methods of making the compounds and devices described herein. Synthesis of the disclosed monomers, oligomers and polymers can be done without undue experimentation based on references in the literature. Example embodied compounds may be found, for example, in U.S. Pat. Nos. 7,705,108, 7,838,623, 8,389,669, 7,893,191, and 8,624,232, all of which are incorporated herein by reference in their entirety. Alternative designs are also contemplated and can be formed using the processes described herein, known in the art, or shown in 88 Appl. Phys. Lett. 223510 (2006) and 9 Org. Electron. 310 (2008), both of which are incorporated by reference.

Construction of embodied devices can be done using methods known in the art. The substrate is generally an inert, non-conductive surface that can be subjected to the necessary conditions to produce the device, including elevated temperatures and organic solvents. Glass, glass ceramics, ceramics, and some plastics may be used. The substrate thickness is based on the needs of the device, such as stability or strength. In some embodiments, the substrate is a glass. In some embodiments, the substrate is an ultrathin and/or flexible glass, such as Corning® Willow® glass. Generally, it may be preferable to have the substrate be transparent where the device is going to be used in a display or emission-based application. A conductive or emitter layer is then placed on the substrate. For example, a transparent conductive oxide can be coated onto the substrate via known methods such as sputter coating. Alternatively, the emitter may comprise a transparent conductive oxide that is sputter coated on the substrate in combination with a polymer layer is then spin coated on the TCO.

In some embodiments, an insulating layer can be coated on the emitter layer. The insulating layer can be a polymer layer, such as polyvinylpyrrolidone (PVP) that incorporates polymer spheres (for example, made of polystyrene and having a diameter of from 30-400 nm) that can be later removed. The insulating layer is then coated with a metal mask layer is produced using one or more known methods, including lithography. The polymer spheres are then removed via solvent, leaving voids in the insulating layer and mask. The device is then coated with the donor-acceptor organic semiconductor and finally the collector layer is patterned on the OSC via known means, such as lithography.

In devices with no insulating layer, a first layer of the donor-acceptor organic semiconductor can be coated on the emitter. Next, polymer spheres (having a diameter of from 30-400 nm) can be coated on the OSC and used as a mask for coating the metal mask layer, which is produced using one or more known methods, including lithography. Subsequently, the polymer beads are removed via solvent, heating, or adhesion to produce the grid. Finally, the collector layer is patterned on the OSC via known means, such as lithography.

EXAMPLES

The following examples are put forth so as to provide those of ordinary skill in the art with a complete disclosure and description of how the materials, articles, and methods described and claimed herein are made and evaluated, and are intended to be purely exemplary and are not intended to limit the scope of the description. Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, desired solvents, solvent mixtures, temperatures, pressures and other reaction ranges and conditions that may be used to optimize the product purity and yield obtained from the described process. Only reasonable and routine experimentation will be required to optimize such process conditions.

Synthesis: The specific example materials, P2TBTD2TDC9BC8C10FT4, PTBTDTDC9BC8C10FT4, and P2TDC8BC8C10DPP2TDC9BC8C10FT4:

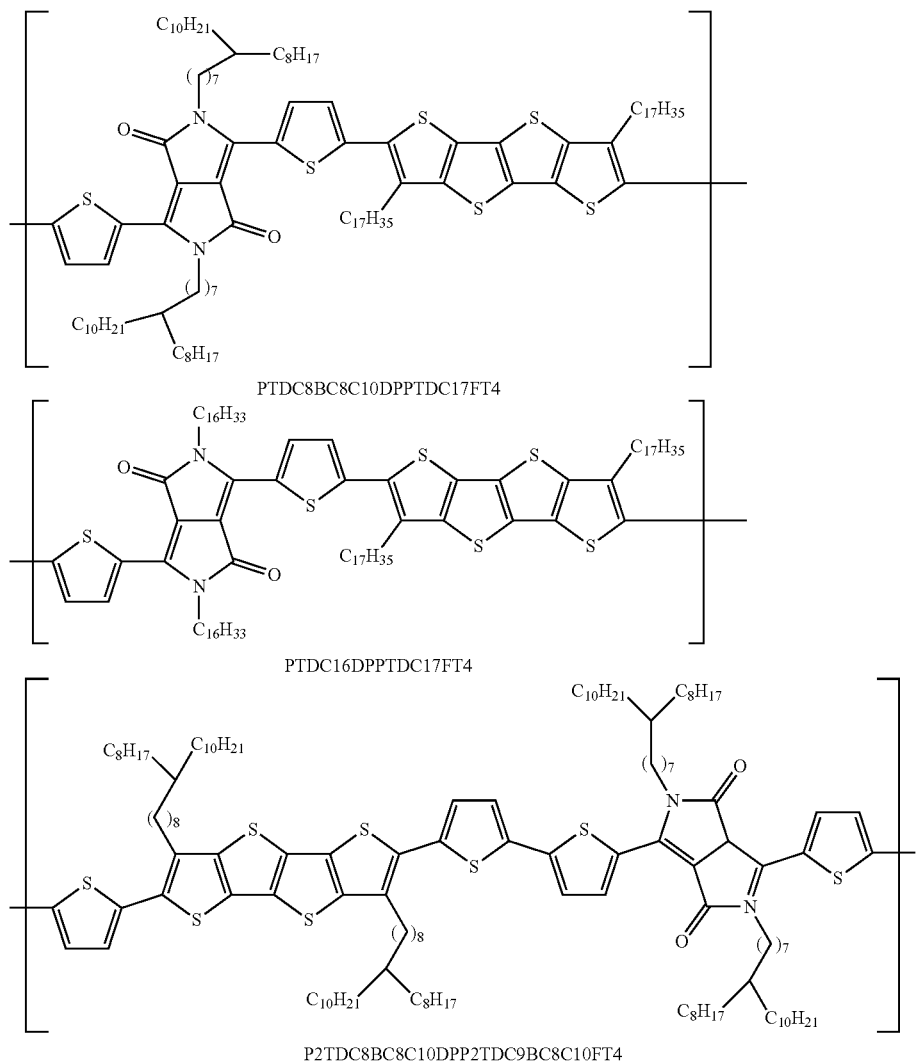

can be synthesized by the general procedures disclosed in U.S. Pat. Nos. 7,705,108, 7,838,623, 8,389,669, and 7,893,191 and described herein. The detailed synthetic procedure is given here for PTBTDTDC9BC8C10FT4 as an example, but can modified and applied to other compounds. The monomers and catalyst materials are weighed into a flask and the solvent (m-xylene) added. The polymerization is then carried out at 125° C. for 1 h. The material is then precipitated, filtered, dried then extracted in a soxhlet to remove any residual monomers and catalyst species. Finally, the polymer is dissolved from the soxhlet, re-precipitated and dried under vacuum. The organic semiconductors (OSC) are used as the active material in vertical transistors with high output current density and a long lifetime without encapsulation.

Device Fabrication, example 1: Device fabrication to produce the device in FIG. 1 is done as follows: A layer of polyvinylpyrrolidone (PVP) is spin coated on the ITO emitter from 8 wt % PVP:PGMEA solution to serve as an insulating layer. A thin surface modification layer (a thin layer of poly(3-hexylthiophene-2,5-diyl) (P3HT)) is coated on PVP to modify the surface energy. Then, polystyrene (PS) spheres (diameter: 200 nm) are adsorbed on the substrate. To prepare a layer of self-assembled PS spheres on a PVP substrate, the substrate is dipped inside the ethanol solution of spheres (1.4 wt %) for 90 s. The spheres are adsorbed on the substrate surface and the wet substrate is then taken out of the ethanol and dipped into boiling isopropyl alcohol (IPA) to rinse away the spheres that are not adsorbed. A stream of nitrogen gas is used to blow-dry the hot IPA to form a monolayer of spheres. The PS spheres serve as a hard mask for the following deposition of the metal grid layer (Al). A layer of Al (40 nm) and a layer of SiO (50 nm) were deposited as an electrode and an insulating layer, respectively. After removing the spheres by Scotch type (3M), openings in the metal grid are formed. Oxygen plasma is used to etch through the PVP to open a channel and to form aluminum oxide on top of the grid. The device is then finished by the deposition of an embodied donor-acceptor organic semiconductor layer (~200-600 nm thick) and then patterning of collector (MoO3/Al).

Characterization: Organic vertical transistors are formed as described herein with organic semiconductor layers comprising PTDC16DPPTDC17FT4 and PTDC8BC8C10DPPTDC17FT4. A first organic vertical transistor incorporating PTDC8BC8C10DPPTDC17FT4 (chlorobenzene as solvent) has an output current density as high as 141 mA/cm$^2$ (FIG. 2A) and an on/off current ratio of about 10$^3$ (FIG. 2B). Additional non-toxic solvents tried in the process include tetraline, cycloctane, and decalin and the corresponding vertical transistor characteristics are shown in FIGS. 3A, 3B, 4A, 4B, 5A, and 5B. The vertical transistors made with the donor-acceptor materials in these solvents show output current densities in the range of ~1 mA/cm$^2$ and the on/off current ratios of 10$^4$918 10$^5$. These characteristics are superior to those shown by conventional P3HT materials, which show output current densities of ~1 mA/cm$^2$ and on/off current ratios of 10$^4$~10$^5$. The device lifetime of vertical transistors that incorporate PTDC8BC8C10DPPTDC17F T4 and PTDC16DPPTDC17FT4 without encapsulation are shown in FIGS. 6 and 7, respectively. Cross-sectional SEM images of the vertical transistors incorporating PTDC16DPPTDC17FT4 and PTDC8BC8C10DPPTDC17FT4 are shown in FIGS. 8 and 9.

Device Fabrication, example 2: In example 1, the PVP surface is treated by a thin layer of P3HT before PS nano-sphere deposition to enhance surface adhesion. In some examples, P3HT may be replaced by a surface treatment of reactive ion etching (ME) for 5 seconds at 70 watt, followed by PS nano-sphere deposition. The PS nano-spheres have a diameter of about 200 nm and are positively charged. The resulting device output current is shown in FIG. 10. The transistor action indicates that P3HT may be replaced without affecting electrical characteristics.

Device Fabrication, example 3: In the vertical transistors of examples 2 and 3, commercially-available P3HT was used as the active material in the channel, resulting in a collector output current density of about 5 mA/cm$^2$. Replacement of P3HT with the polymer of Formula 1 may provide a higher vertical hole mobility in the channel, with the resulting collector output current density being as high as 141 mA/cm$^2$ for operation voltages below 1.5V, as shown in FIG. 11. This is much higher than a typical current density of 1-10 mA/cm$^2$ for OLED. Thus, vertical transistors comprising Formula 1 active material in the channel have the advantage of low-voltage driving for the OLED pixel in the active-matrix display.

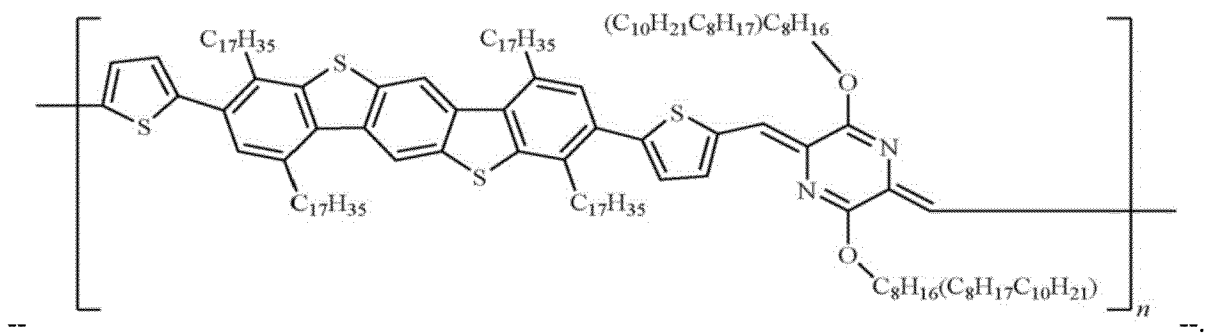

The invention claimed is:

1. A device comprising:
   a substrate;
   a collector layer;
   an emitter layer positively biased relative to the collector layer;
   a semiconductor layer located between the collector layer and the emitter layer, the semiconductor layer comprising an organic semiconductor polymer with the structure:

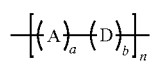

(I)

wherein each D is an independently selected conjugated electron donating aromatic or heteroaromatic group having from 5 to 50 backbone atoms and each D group is optionally substituted with one or more electron donating substituents or electron withdrawing substituents, provided that even when substituted the electronic character of each D is electron donating; each A is an independently selected conjugated electron accepting aromatic or heteroaromatic group having from 5 to 50 backbone atoms or an ethenylene group substituted with one or two electron withdrawing substituents, each A being optionally substituted with one or more electron donating substituents or electron withdrawing substituents provided that even when substituted the electronic character of each A is electron accepting; each of a and b is an integer from 1 to 4, and n is an integer from 2 to 10,000.

2. The device of claim 1, wherein each D is independently one of:

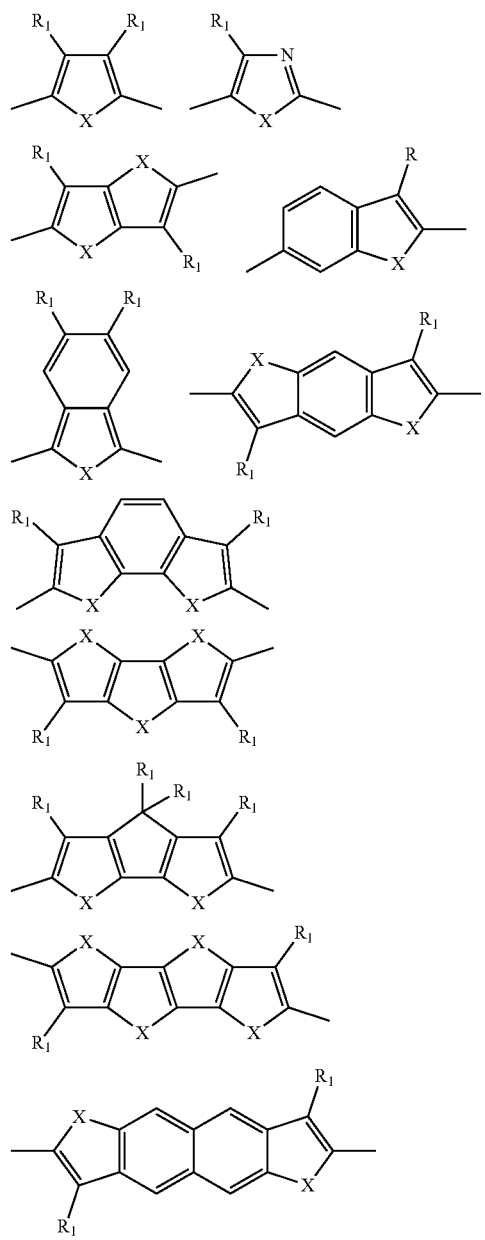

-continued

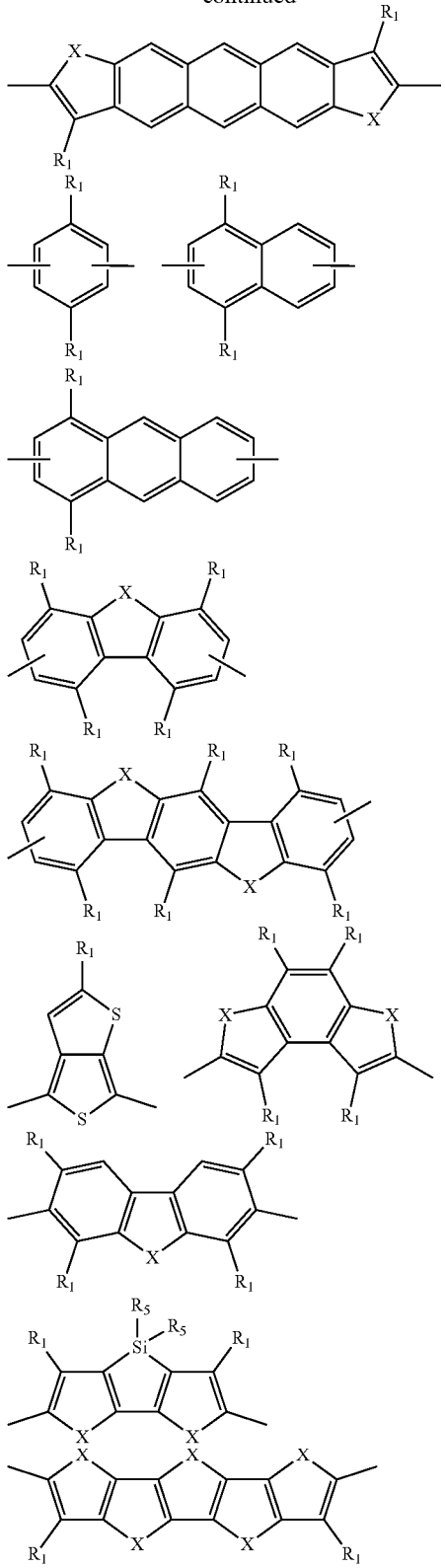

where each x is independently NR$_6$, S, Se, or O; each R$_1$ is independently hydrogen, C$_1$-C$_{40}$ alkyl, C$_1$-C$_{40}$ alkenyl, C$_1$-C$_{40}$ alkynyl, C$_1$-C$_{40}$ alkoxy, C$_1$-C$_{40}$ cycloalkyl, C$_1$-C$_{40}$ aryl, C$_1$-C$_{40}$ heteroaryl, C$_1$-C$_{40}$ heterocycloalkyl, C$_1$-C$_{40}$ conjugated group, any of which may be optionally substituted, or halo; each R$_5$ is independently hydrogen, C$_1$-C$_{40}$ alkyl, C$_1$-C$_{40}$ alkenyl, C$_1$-C$_{40}$ alkoxy, C$_1$-C$_{40}$ cycloalkyl, C$_1$-C$_{40}$ aryl, C$_1$-C$_{40}$ heteroaryl, or C$_1$-C$_{40}$ conjugated group, any of which may be optionally substituted; and each R$_6$ is independently hydrogen, C$_1$-C$_{40}$ alkyl.

3. The device of claim 1, wherein each A is independently one of:

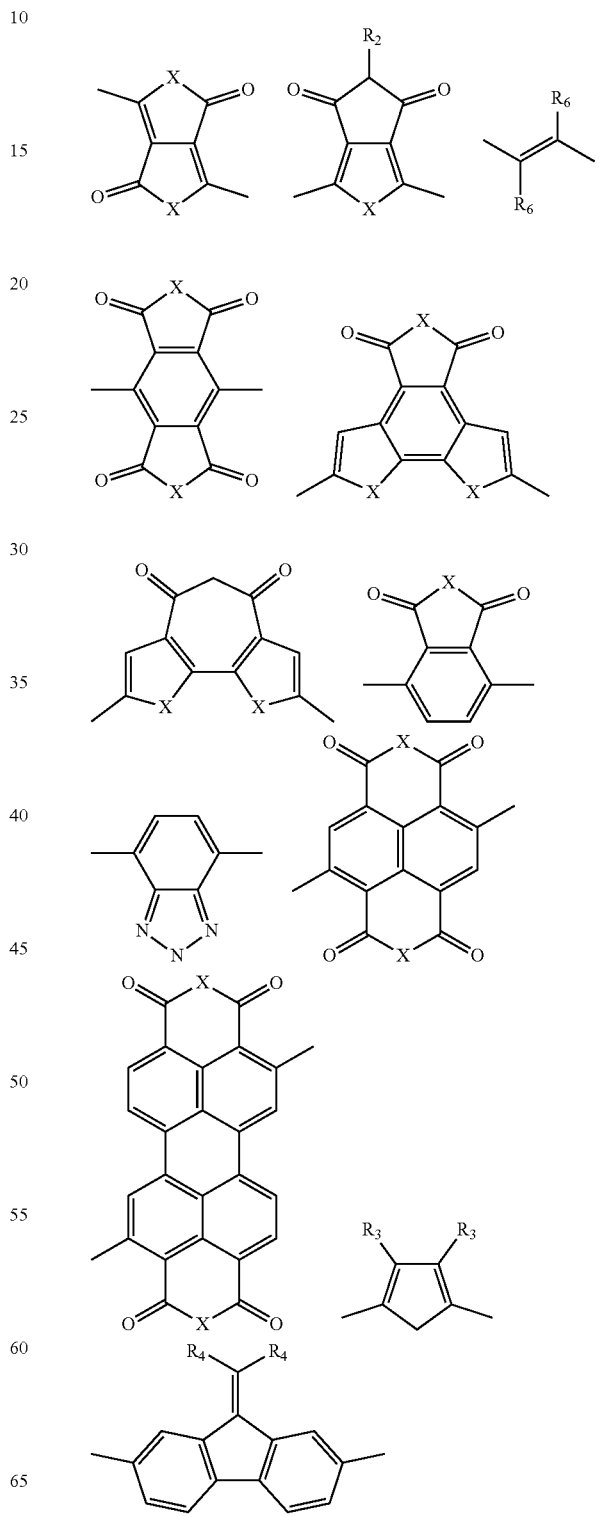

-continued

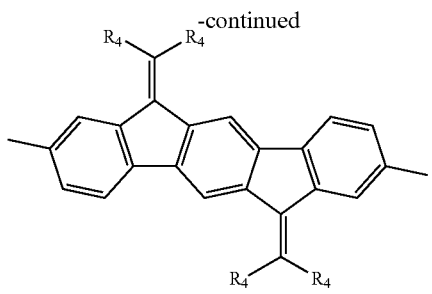

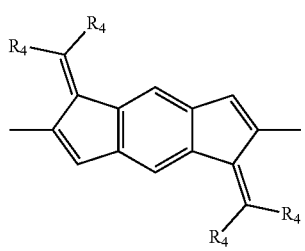

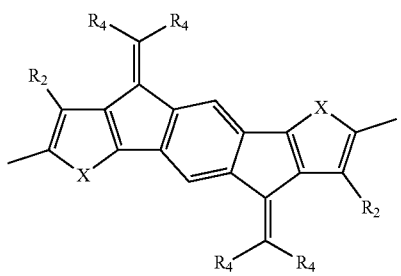

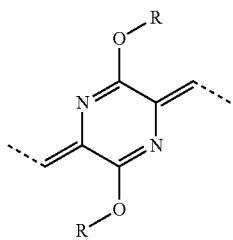

where each x is independently NR₅, S, Se, or O; each R₂ is independently hydrogen, $C_1$-$C_{40}$ alkyl, $C_1$-$C_{40}$ alkenyl, $C_1$-$C_{40}$ alkynyl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo; each R₃ is independently hydrogen, $C_1$-$C_{40}$alkyl, $C_1$-$C_{40}$ alkenyl, $C_1$-$C_{40}$ alkoxy, $C_1$-$C_{40}$ cycloalkyl, $C_1$-$C_{40}$ aryl, $C_1$-$C_{40}$ heteroaryl, or $C_1$-$C_{40}$ conjugated group, any of which may be optionally substituted; each R₄ is independently hydrogen, $C_1$-$C_{40}$ alkyl, cyano, ester, or carboxylic acid, and each R₆ is independently hydrogen, $C_1$-$C_{40}$alkyl, cyano, ester, or carboxylic acid.

4. The device of claim 2, wherein one or more of R₁, R₂, R₃, R₄, and R₆ is an optionally substituted $C_{15}$-$C_{35}$ alkyl.

5. The device of claim 4, wherein one or more of R₁, R₂, R₃, or R₄ is an optionally substituted $C_{15}$-$C_{35}$ alkyl having at least one branching point.

6. The device of claim 5, wherein one or more of R₁, R₂, or R₃ can be optionally substituted $C_{15}$-$C_{35}$ alkyl.

7. The device of claim 6, wherein each R₁ or R₂ is independently an optionally substituted $C_{15}$-$C_{35}$ alkyl.

8. The device of claim 7, wherein each R₁ or R₂ is independently an optionally substituted $C_{15}$-$C_{35}$ alkyl having at least one branching point.

9. The device of claim 8, wherein each R₁ or R₂ is independently an optionally substituted $C_{15}$-$C_{35}$ alkyl having at least one branching point, where the branching point is at least 4 carbons from the base molecule.

10. The device of claim 1, wherein at least one D is:

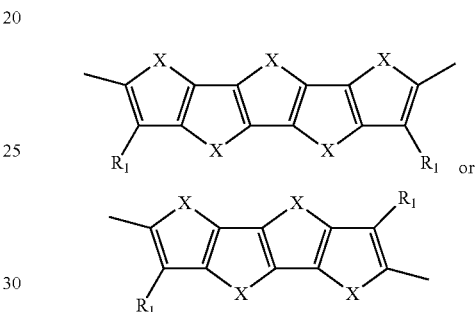

where each X is independently NR₆, S, Se, or O; and each R₁ is independently hydrogen, $C_1$-$C_{40}$ alkyl, $C_1$-$C_{40}$ alkenyl, $C_1$-$C_{40}$ alkynyl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo, and each R₆ is independently hydrogen, $C_1$-$C_{40}$ alkyl.

11. The device of claim 1, wherein at least one A is:

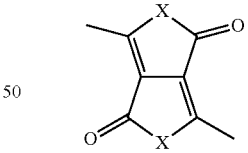

where each x is independently NR₅, S, Se, or O; each R₅ is independently hydrogen, $C_1$-$C_{40}$ alkyl.

12. The device of claim 1, wherein A is:

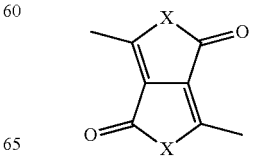

D is:

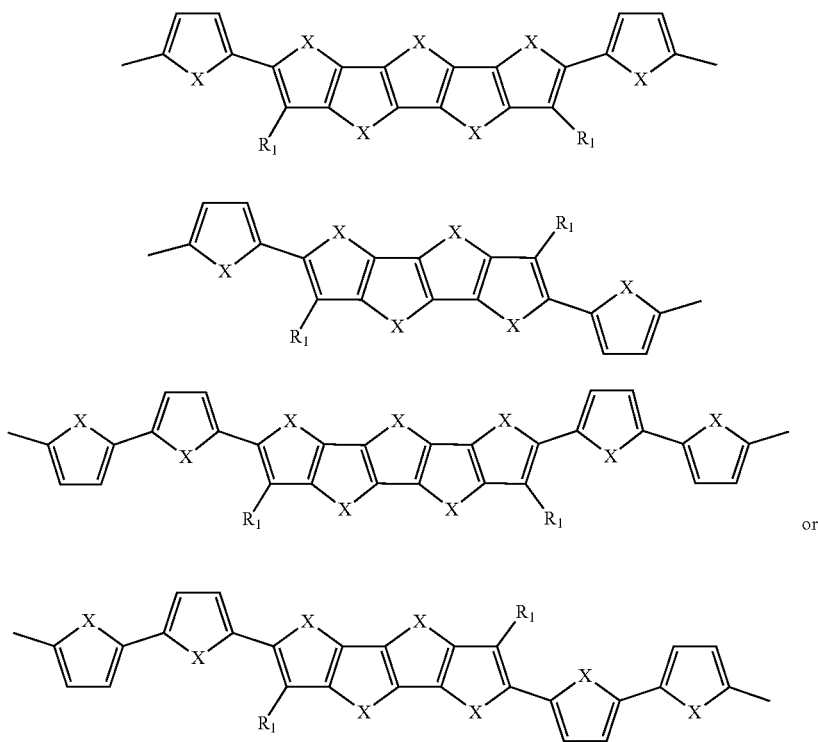

where each X is independently $NR_6$, S, Se, or O; and each $R_1$ is independently hydrogen, $C_1$-$C_{40}$ alkyl, $C_1$-$C_{40}$ alkenyl, $C_1$-$C_{40}$ alkynyl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo and each $R_6$ is independently hydrogen, $C_1$-$C_{40}$ alkyl.

13. The device of claim 12, wherein each $R_1$ is independently an optionally substituted $C_{15}$-$C_{35}$ alkyl having at least one branching point.

14. The device of claim 1, wherein the collector layer comprises aluminum.

15. The device of claim 1, wherein the emitter layer comprises indium tin oxide.

16. The device of claim 1, wherein the emitter layer comprises poly(3,4-ethylenedioxythiophene) doped with polystyrene sulfonated acid.

17. The device of claim 1, wherein the organic semiconductor polymer is:

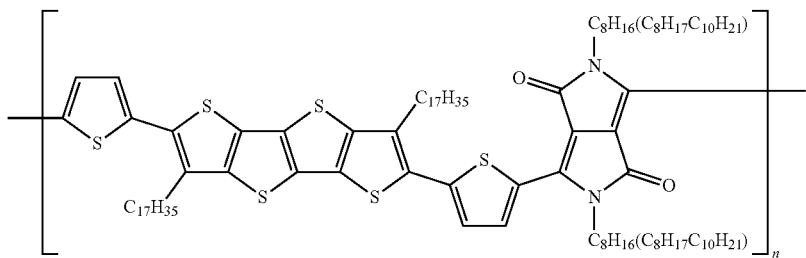

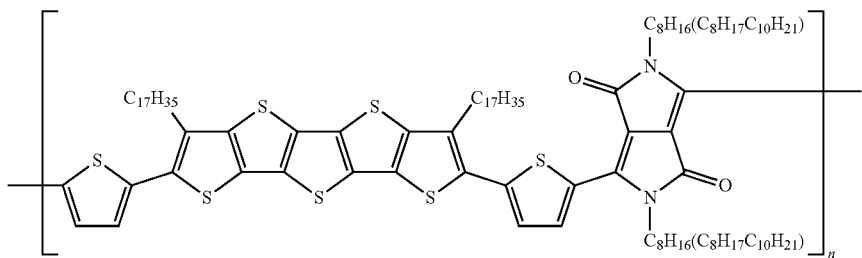

-continued
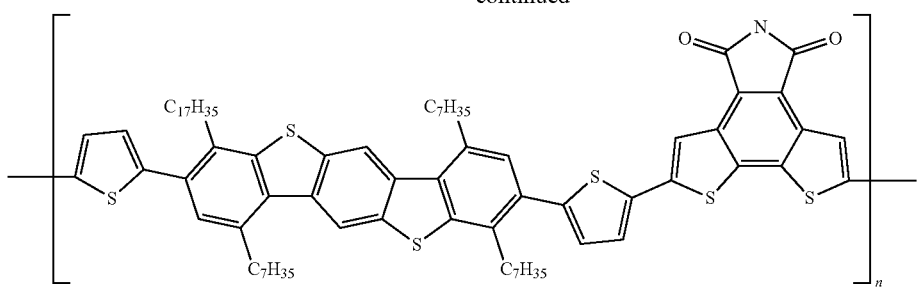
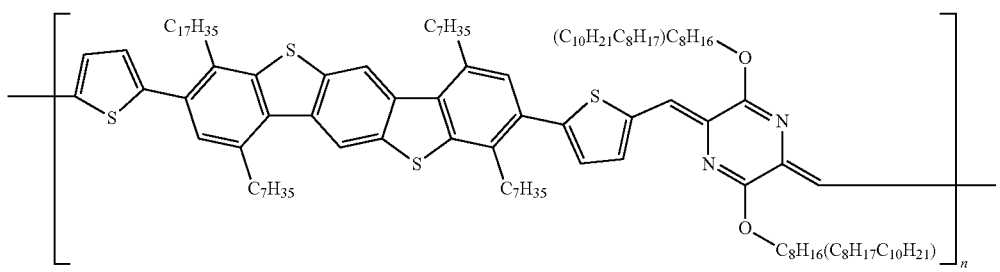
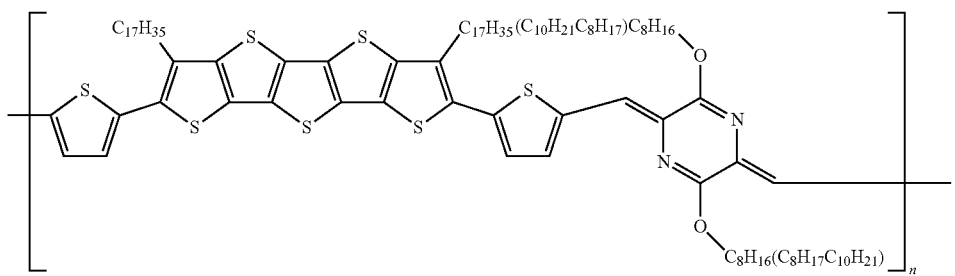
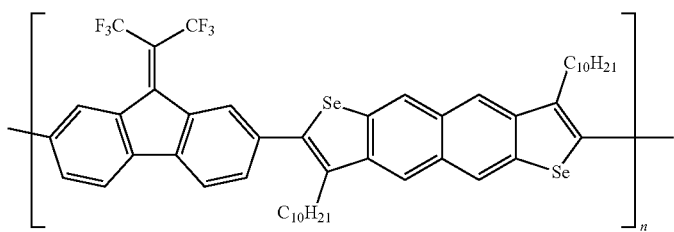
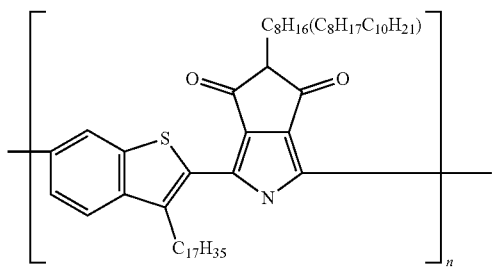
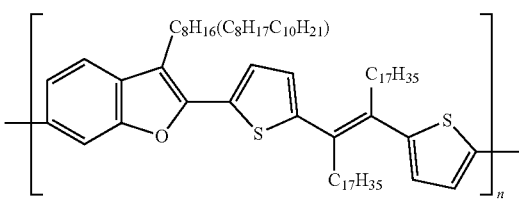
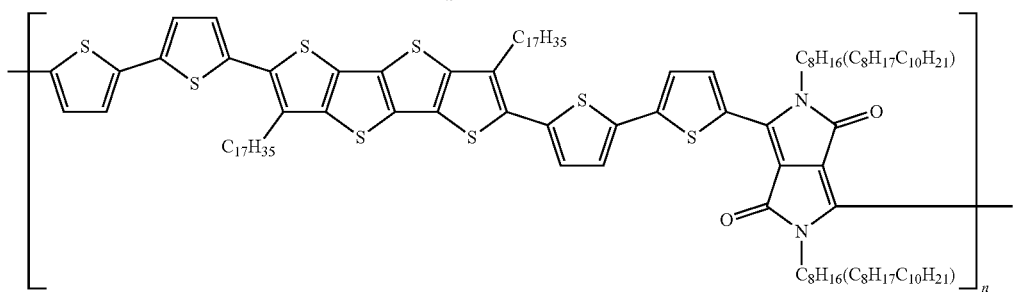

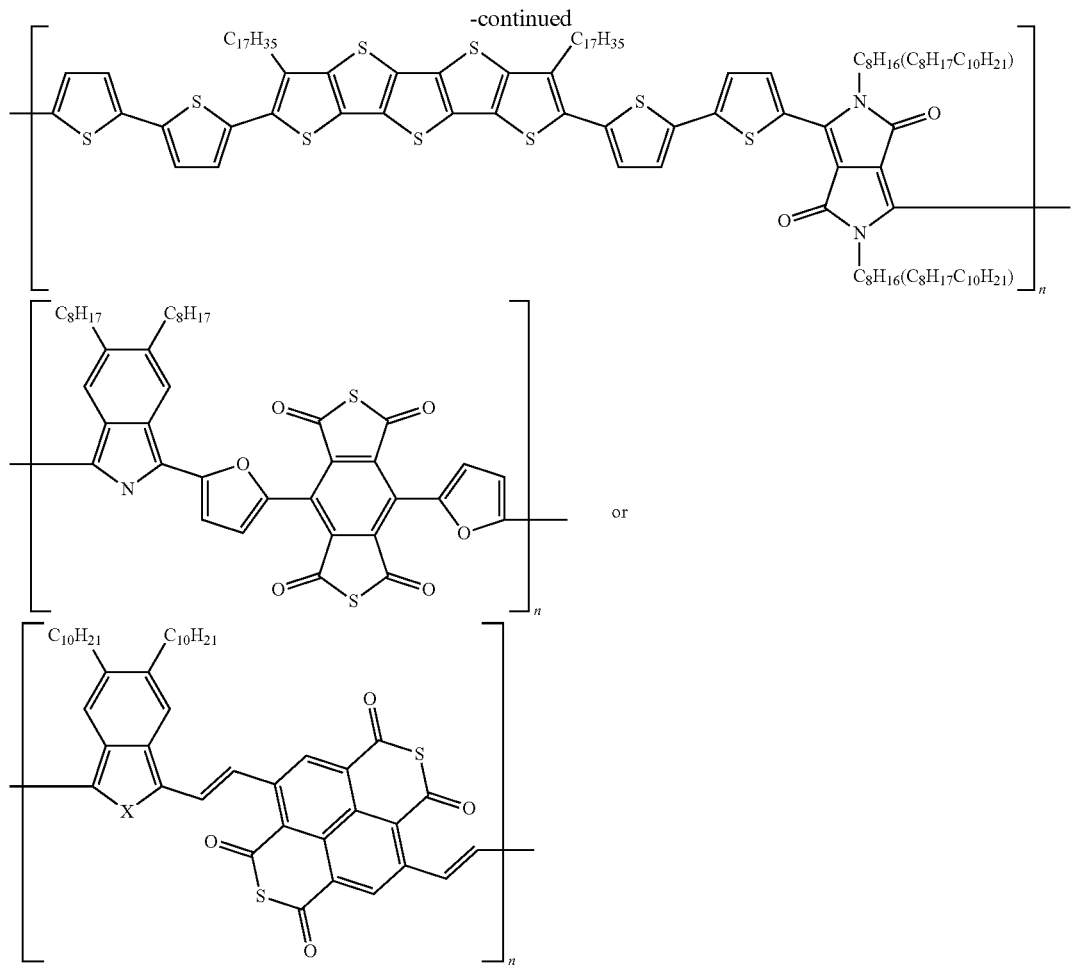
where n is from 2 to 10000.
18. The device of claim 1, wherein the collector layer is configured to have an output current density of at least 80 mA/cm$^2$ for operation voltages below 1.5V.
19. The device of claim 1, wherein the device can have a current density from 80 mA/cm$^2$ to 160 mA/cm$^2$ for operation voltages below 2V.
* * * * *

UNITED STATES PATENT AND TRADEMARK OFFICE
CERTIFICATE OF CORRECTION

PATENT NO. : 11,737,361 B2
APPLICATION NO. : 17/873240
DATED : August 22, 2023
INVENTOR(S) : Mingqian He et al.

Page 1 of 3

It is certified that error appears in the above-identified patent and that said Letters Patent is hereby corrected as shown below:

In the Claims

In Column 35, Lines 8-15, in Claim 2, delete " 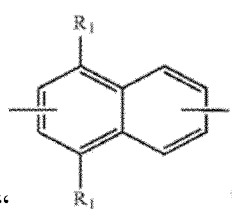 " and insert -- 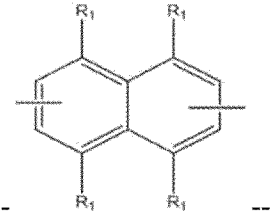 --.

In Column 35, Lines 16-23, in Claim 2, delete " 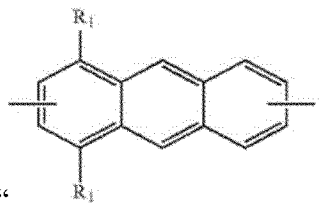 " and insert 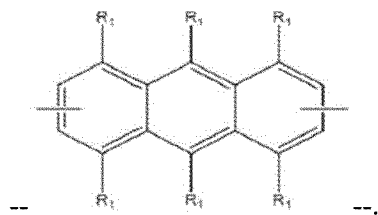 --.

In Column 36, Line 2, in Claim 2, delete "$C_1$-$C_{40}$alkyl," and insert -- $C_1$-$C_{40}$ alkyl, --.

In Column 36, Line 5, in Claim 2, delete "$C_1$-$C_{40}$alkyl." and insert -- $C_1$-$C_{40}$ alkyl. --.

Signed and Sealed this
Sixteenth Day of July, 2024

Katherine Kelly Vidal
*Director of the United States Patent and Trademark Office*

In Column 36, Lines 40-45, in Claim 3, delete " 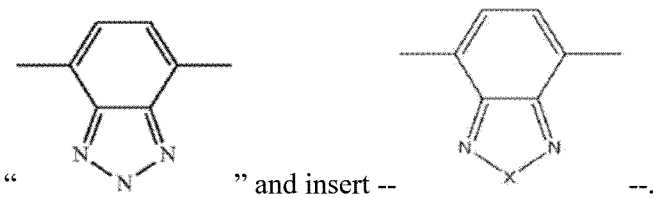 " and insert -- --.

In Column 37, Line 60, in Claim 3, delete "$C_1$-$C_{40}$alkyl," and insert -- $C_1$-$C_{40}$ alkyl, --.

In Column 37, Line 65, in Claim 3, delete "$C_1$-$C_{40}$alkyl," and insert -- $C_1$-$C_{40}$ alkyl, --.

In Column 39, Line 37, in Claim 12, delete "$C_1$-$C_{40}$heteroaryl," and insert -- $C_1$-$C_{40}$ heteroaryl, --.

In Column 39, Line 39, in Claim 12, delete "$C_1$-$C_{40}$alkyl." and insert -- $C_1$-$C_{40}$ alkyl. --.

In Columns 41-42, Lines 1-10, first structure, in Claim 17, delete

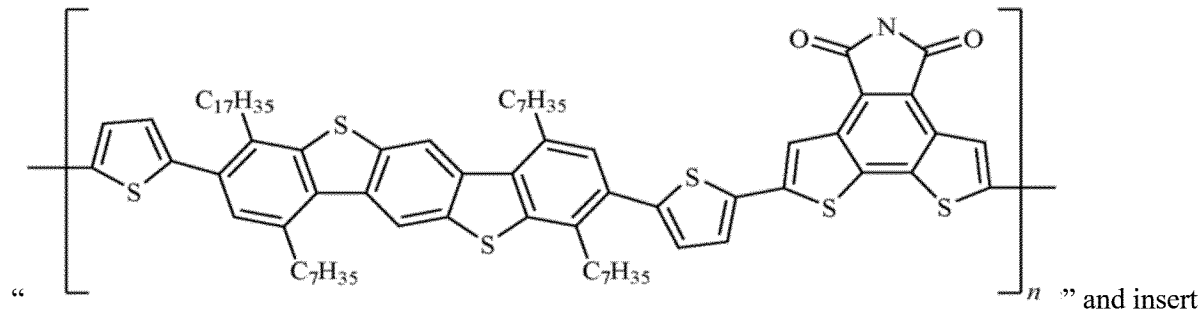

" and insert

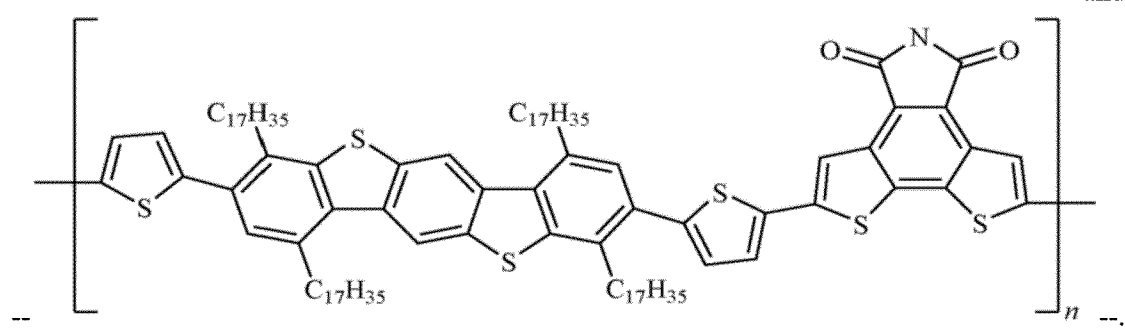

--.

In Columns 41-42, Lines 11-20, second structure, in Claim 17, delete

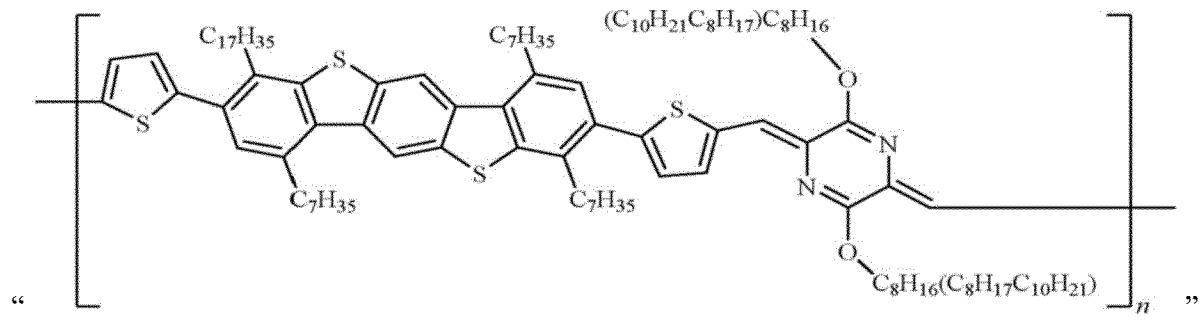

"

and insert